(12) United States Patent
Cochran

(10) Patent No.: US 11,774,648 B2
(45) Date of Patent: Oct. 3, 2023

(54) CORNER-CUBE IRRADIATION CONTROL

(75) Inventor: Don W. Cochran, Gates Mills, OH (US)

(73) Assignee: PTI IP LLC, Solon, OH (US)

( * ) Notice: Subject to any disclaimer, the term of this patent is extended or adjusted under 35 U.S.C. 154(b) by 0 days.

(21) Appl. No.: 13/102,588

(22) Filed: May 6, 2011

(65) Prior Publication Data

US 2012/0063752 A1    Mar. 15, 2012

Related U.S. Application Data

(60) Provisional application No. 61/332,512, filed on May 7, 2010.

(51) Int. Cl.
| | |
|---|---|
| F24C 7/04 | (2021.01) |
| F27B 9/06 | (2006.01) |
| F27B 9/34 | (2006.01) |
| F27B 9/36 | (2006.01) |
| F27D 1/00 | (2006.01) |
| F27D 11/02 | (2006.01) |
| G02B 5/124 | (2006.01) |
| F24C 15/22 | (2006.01) |
| H01L 31/0232 | (2014.01) |

(52) U.S. Cl.
CPC .............. *G02B 5/124* (2013.01); *F24C 7/046* (2013.01); *F24C 15/22* (2013.01); *F27B 9/34* (2013.01); *F27D 1/0036* (2013.01); *H01L 31/02327* (2013.01); *F27B 9/062* (2013.01)

(58) Field of Classification Search
None
See application file for complete search history.

(56) References Cited

U.S. PATENT DOCUMENTS

| | | | | |
|---|---|---|---|---|
| 2,682,807 | A * | 7/1954 | Onksen | 359/532 |
| 4,066,331 | A * | 1/1978 | Lindner | 359/514 |
| 4,095,773 | A * | 6/1978 | Lindner | 249/117 |
| 4,160,577 | A * | 7/1979 | Berg | F28F 13/18 |
| | | | | 359/351 |
| 4,303,305 | A | 12/1981 | Jones | |
| 4,344,673 | A * | 8/1982 | Holdridge | 359/852 |

(Continued)

FOREIGN PATENT DOCUMENTS

| | | |
|---|---|---|
| CN | 1723400 A | 1/2006 |
| CN | 1964584 A | 5/2007 |

(Continued)

OTHER PUBLICATIONS

International Search Report for PCT/US11/35569 dated Aug. 22, 2011.

(Continued)

*Primary Examiner* — Joseph M. Pelham
(74) *Attorney, Agent, or Firm* — Lippes Mathias LLP

(57) ABSTRACT

A system and method for utilizing corner-cube reflector technology for irradiation control in direct radiant heating systems is described. The system and method has application in many types of direct irradiation heating systems and is applicable to both narrowband or broadband directed irradiation heating systems. The purpose and result of the implementation is to improve the overall system efficiency through the redirection of photons back to a targeted item which is being heated or treated with the irradiation energy.

50 Claims, 11 Drawing Sheets

(56) References Cited

U.S. PATENT DOCUMENTS

| | | | |
|---|---|---|---|
| 4,398,587 A | | 8/1983 | Boyd |
| RE31,765 E | * | 12/1984 | Guibert ................ 219/400 |
| 4,586,485 A | * | 5/1986 | Koba et al. ............ 126/248 |
| 6,010,609 A | * | 1/2000 | Mimura .......... B29C 33/3857 |
| | | | 205/70 |
| 6,013,900 A | | 1/2000 | Westerberg et al. |
| 6,361,301 B1 | | 3/2002 | Scaglotti et al. |
| 6,610,213 B1 | | 8/2003 | Schwab et al. |
| 6,815,645 B2 | | 11/2004 | Abe |
| 6,970,644 B2 | | 11/2005 | Koren et al. |
| 7,154,066 B2 | * | 12/2006 | Talwar et al. .......... 219/121.8 |
| 7,325,679 B2 | | 2/2008 | Severa et al. |
| 7,399,945 B2 | | 7/2008 | Talwar et al. |
| 7,453,051 B2 | | 11/2008 | Timans |
| 7,847,218 B2 | * | 12/2010 | Timans ................ 219/390 |
| 8,303,290 B2 | | 11/2012 | Feuilloley et al. |
| 8,375,933 B2 | * | 2/2013 | Myers ................ 126/204 |
| 9,366,790 B2 | * | 6/2016 | Spurgeon ........... B29D 11/0073 |
| 2002/0144987 A1 | * | 10/2002 | Tomlinson et al. ...... 219/121.74 |
| 2004/0013856 A1 | * | 1/2004 | Araki et al. ............ 428/167 |
| 2004/0027936 A1 | | 2/2004 | Ishikawa |
| 2004/0114243 A1 | | 6/2004 | Couzin et al. |
| 2006/0091120 A1 | * | 5/2006 | Markle ................ 219/121.65 |
| 2006/0139754 A1 | * | 6/2006 | Bacon ................ G02B 5/124 |
| | | | 359/530 |
| 2006/0186115 A1 | * | 8/2006 | Joines et al. .......... 219/678 |
| 2006/0196871 A1 | * | 9/2006 | Risman et al. .......... 219/691 |
| 2006/0280825 A1 | | 12/2006 | Cochran et al. |
| 2008/0008460 A1 | * | 1/2008 | Timans ................ 392/416 |
| 2008/0050688 A1 | * | 2/2008 | Timans ................ 432/9 |
| 2008/0273867 A1 | * | 11/2008 | Camm et al. .......... 392/416 |
| 2009/0095724 A1 | * | 4/2009 | Talwar et al. .......... 219/121.72 |
| 2009/0098742 A1 | | 4/2009 | Timans |
| 2009/0185265 A1 | | 7/2009 | Myers |
| 2009/0301124 A1 | | 12/2009 | Kalfon |
| 2010/0314377 A1 | * | 12/2010 | Kasai et al. .......... 219/201 |
| 2011/0089166 A1 | * | 4/2011 | Hunter et al. .......... 219/647 |
| 2011/0155001 A1 | * | 6/2011 | Chapman et al. ........ 101/28 |
| 2012/0038984 A1 | * | 2/2012 | Patel ................ G02B 5/124 |
| | | | 359/530 |
| 2012/0048722 A1 | * | 3/2012 | McLean et al. .......... 204/192.1 |
| 2012/0063752 A1 | * | 3/2012 | Cochran ................ 392/416 |
| 2012/0279944 A1 | * | 11/2012 | Kasai et al. ............ 219/50 |
| 2012/0281285 A1 | * | 11/2012 | Orensteen .......... G09F 13/16 |
| | | | 359/530 |
| 2014/0078586 A1 | * | 3/2014 | Spurgeon .......... G02B 5/124 |
| | | | 359/530 |
| 2015/0049384 A1 | * | 2/2015 | Coggio .......... G02B 5/0242 |
| | | | 359/530 |
| 2016/0274279 A1 | * | 9/2016 | Spurgeon ............ G02B 1/04 |

FOREIGN PATENT DOCUMENTS

| | | |
|---|---|---|
| CN | 101198889 A | 6/2008 |
| DE | 10141639 A1 | 3/2003 |
| JP | S56-001289 A | 1/1981 |
| JP | H01-028361 B | 1/2001 |
| JP | 2001-516868 A | 10/2001 |
| JP | 2003-523848 A | 8/2003 |
| JP | 2005-509281 A | 4/2005 |
| JP | 2006-024860 A | 1/2006 |
| JP | 2006-069094 A | 3/2006 |
| JP | 2007-046852 A | 2/2007 |
| JP | 2008-520467 A | 6/2008 |
| WO | WO 02/072343 A1 | 9/2002 |
| WO | WO 2006/002751 A | 1/2006 |
| WO | WO 2008/132603 A1 | 11/2008 |
| WO | WO 2009/094515 A2 | 7/2009 |

OTHER PUBLICATIONS

IMOS Gubela, IMOS guides the light, 12 pages, Printed in Germany 2007 solia.

IMOS, http://www.imos-qubela.com/, 12 pages, printed May 7, 2010.

* cited by examiner

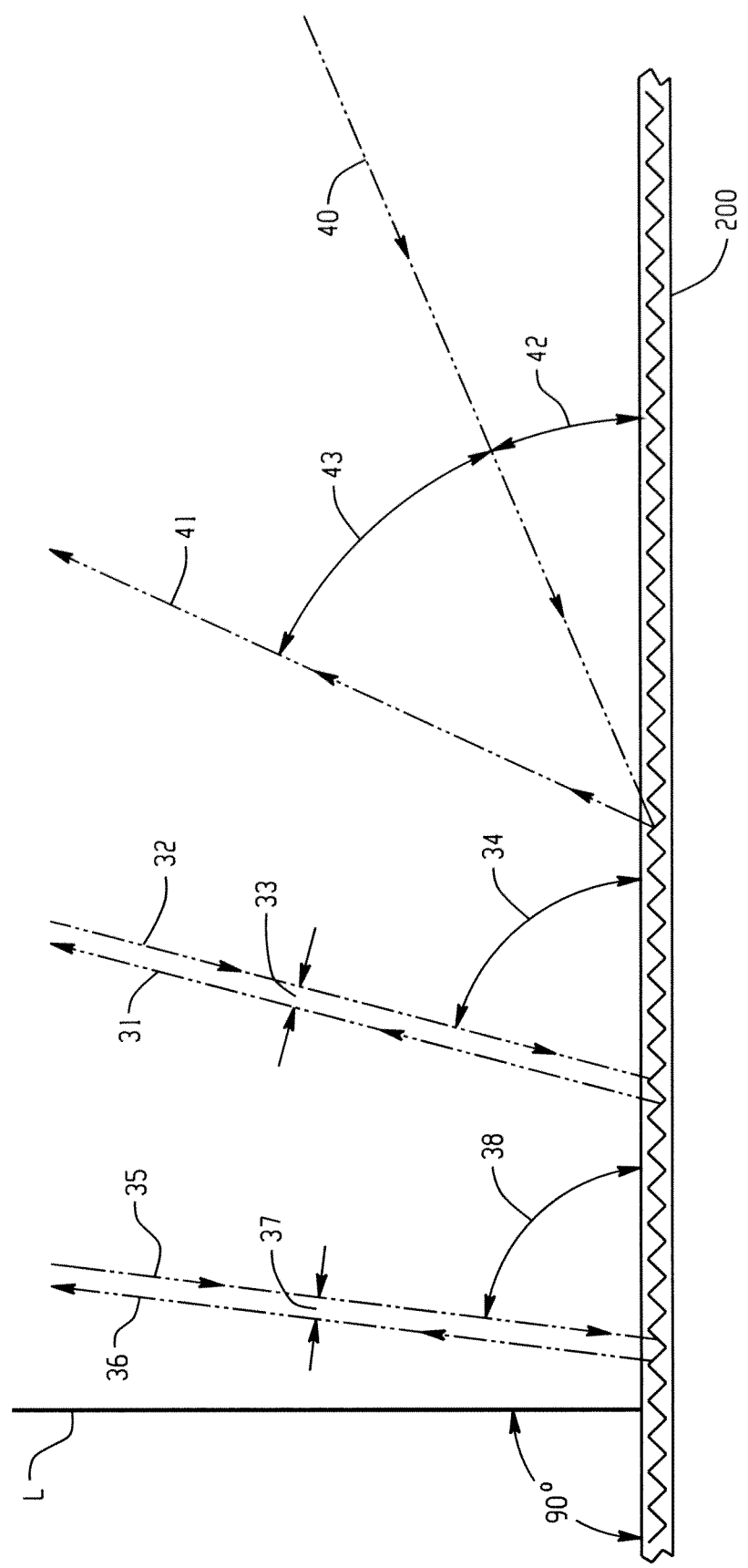

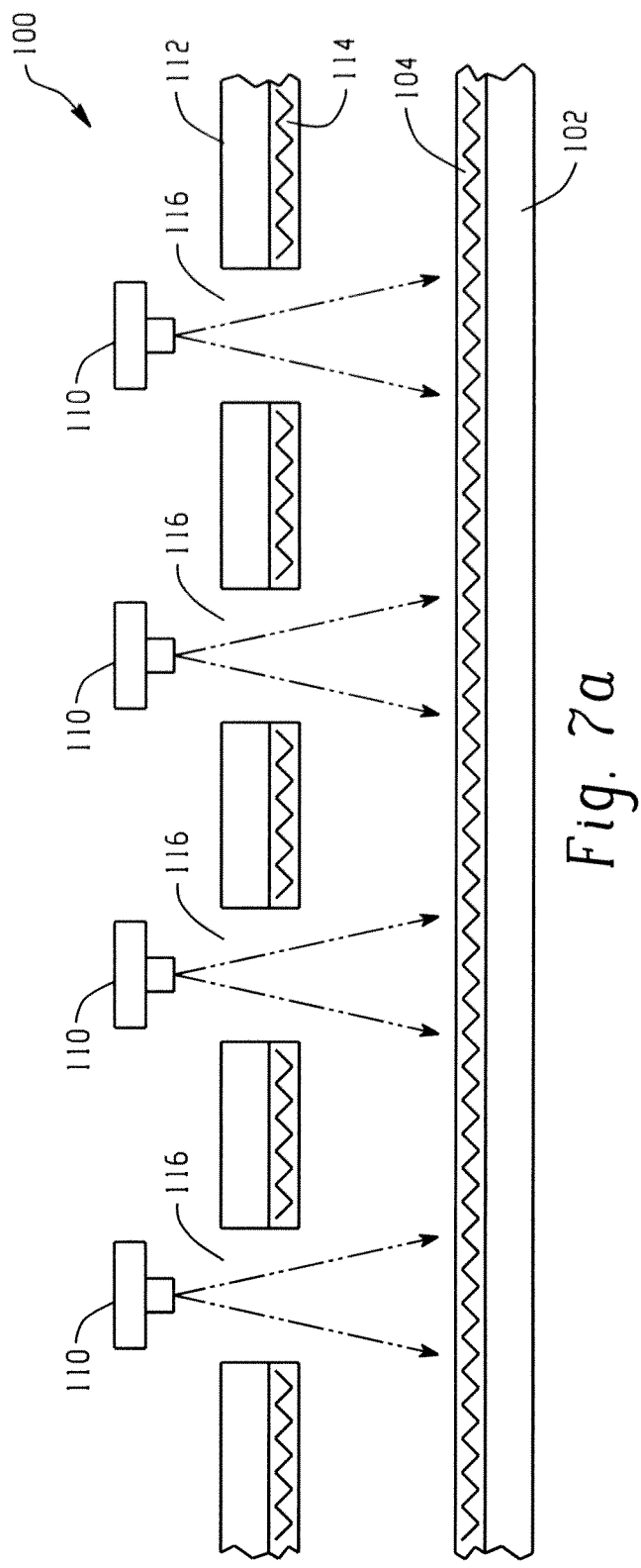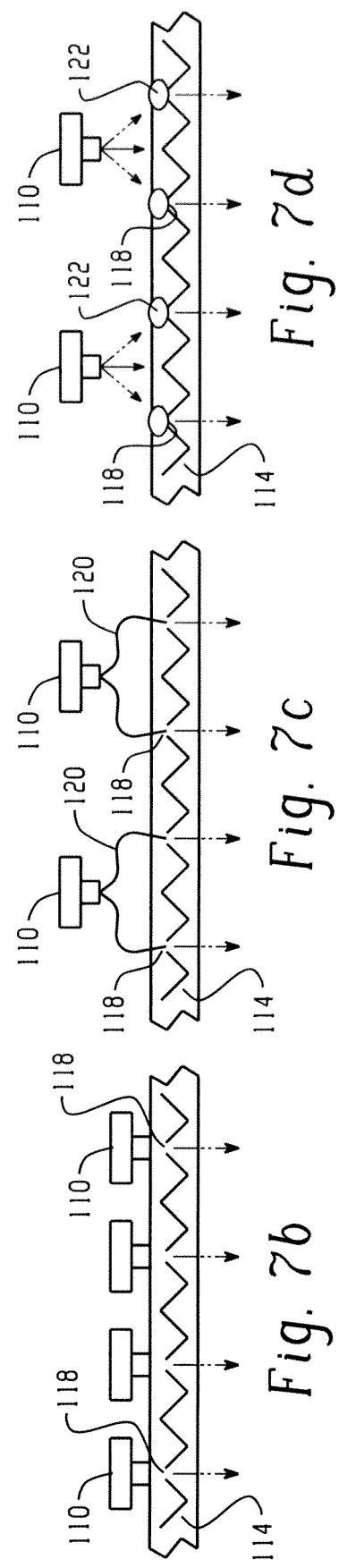

CORNER-CUBE IRRADIATION CONTROL

This application claims priority to and the benefit of U.S. provisional patent application Ser. No. 61/332,512, filed on May 7, 2010, the disclosure of which is incorporated herein by reference.

BACKGROUND

The present exemplary embodiment relates to systems and methods for irradiating a target item. It finds particular application in conjunction with improving the irradiation efficiency in systems and methods where a target item is being actively irradiated, and will be described with particular reference thereto. However, it is to be appreciated that the present exemplary embodiment is also amenable to other like applications.

The heating or irradiation of products has always had a challenge associated with it, whereby much of the active energy of the irradiation process, which strikes a target item being irradiated, is lost. For example, many of the photons of irradiation that strike the target item are either reflected, transmitted through, or back-scattered and are not absorbed by the target item. If the purpose of the active irradiation process is to heat or treat the target, then the efficiency of the process is reduced as a function of the percentage of photons that are not absorbed by the target. For example, as food is irradiated, it is not uncommon for 30%-60% of the photons to be back-scattered at random angles away from the food target. The exact percentages of back-scatter depends on and will vary with the exact wavelength of the irradiation, as well as the physical properties of the food itself. Additionally, some foods and other materials will have transmission characteristics such that the photons will pass through the target items and will exit out the opposite side of the target. Regardless of whether the photons are back-scattered from the target material, are reflected, or exit after passing through the target material, they are wasted energy unless they can be somehow returned back to the target item. Irradiation energy and the costs to produce it have risen dramatically in recent decades, so any techniques for improving the efficiency is much desired by all. The present exemplary embodiment is a novel technology for increasing the efficiency of active irradiation systems.

The problem of wasted photons, as described above, is common to many different active or directed irradiation treatment and active irradiation heating systems. Often, because of the difficulty of the problem, little or no effort is made to "recycle" the photons and return them back to the target item to get additional useful absorption function out of the otherwise wasted photons. If an effort is made to provide some form of return means, it usually involves some type of flat reflector which is bent or formed into an ellipsoidal or a parabolic shape in order to function as a reflector. This becomes extremely complicated from a design standpoint because such mathematical shapes typically work in relation to a specific focal point or set of focal points. The efficient design of a reflector system becomes an intensive exercise in determining dimensions and suitable geometry resulting in difficulty designing configurations of simple or sophisticated reflectors applicable through a large range of sizes. It, therefore, becomes a very difficult design challenge that is often ignored, to the detriment of systemic and energy efficiency.

To the extent that large, flat, reflective surfaces are used, they may be so ineffective at actually increasing efficiency that it may be wasted effort to provide them. Multiple large, flat surfaces placed at thoughtful angles to one another may provide some random effect, but it is not universally helpful. Even if such a reflector configuration provides some nominal effectiveness, it rarely provides the functionality of returning the photons back to the exact positions on the target item where they are intended to be most useful. If a target item is to be irradiated inside a rectangular oven cavity, the walls could be made of, or covered with, a reflective material. Unfortunately, even with the interior walls of the oven orthogonal to one another, the desired result will not be achieved. This can be easily illustrated by using an example of a billiards table. If we place a target ball somewhere on the table, and then randomly aim a second ball (representing the path of a photon) we can define thousands of ricochet patterns which will never strike the target ball. In fact, the second ball is likely to bounce from bumper to bumper to bumper until it runs out of energy without striking the target ball. A photon similarly looses energy to the walls with every bounce or reflection (which energy exhaustion will depend on what type of material it is striking) and may exhaust its energy before it ever reaches the item targeted for irradiation.

BRIEF DESCRIPTION

In one aspect of the presently described embodiments, the system for irradiation treating or processing a target item comprises an irradiation source operative to produce irradiation, the irradiation source configured to direct irradiation toward a target item, and an irradiation zone in which the target will be located for irradiation, the irradiation zone being at least partially defined by proximate corner-cube reflector material, the corner cube reflector material comprising an array of corner cube reflectors and being operative to reflect irradiation back to the target item, irradiation which has been, at least one of, reflected from, back-scattered from, or passed through the target item.

In another aspect of the presently described embodiments, the system is a cooking oven.

In another aspect of the presently described embodiments, the target item is a food or organic item.

In another aspect of the presently described embodiments, the system is included within a bottle forming system.

In another aspect of the presently described embodiments, the target item is a plastic bottle preform.

In another aspect of the presently described embodiments, the corner cube reflector material includes at least one operative through which irradiation can be directed through the corner cube material toward the target item.

In another aspect of the presently described embodiments, the corner cube reflector material comprises a portion of the enclosure of the irradiation zone.

In another aspect of the presently described embodiments, the corner cube reflector material comprises more than half the enclosure of the irradiation zone.

In another aspect of the presently described embodiments, the corner cube reflector material covers essentially all of the interior surface of the oven irradiation zone except, in some cases, that the corner cube reflector material does not cover irradiation sources.

In another aspect of the presently described embodiments, the corner cube reflector material is located such that it is strategically located in at least some areas where stray irradiation would be likely to need redirection to the target item.

In another aspect of the presently described embodiments, the corner cube reflector material circumferentially surrounds around the long axis of the preform but allows for access to get preforms in and out of the irradiation chamber to facilitate high speed production.

In another aspect of the presently described embodiments, the access consists of allowing for either a linear or arcuate travel path through the irradiation chamber.

In another aspect of the presently described embodiments, the corner cube material surrounds the preform, forming an irradiation chamber during at least part of the time during which it is being irradiated.

In another aspect of the presently described embodiments, the corner cube material incorporates a colored pigment such that the material appears as a colored surface to a human viewer and such that the corner cube material is functional at wavelengths of irradiation.

In another aspect of the presently described embodiments, the corner cube material is coated on at least one of a front or back surface such that the material reflects at least 85% of wavelengths above 750 nm.

In another aspect of the presently described embodiments, the corner cube material is coated on at least one of a front or back surface and reflects at least 95% of wavelengths.

In another aspect of the presently described embodiments, the corner cube material is operative to function above 1600 nm In another aspect of the presently described embodiments, the corner cube material coating is at least one of aluminum, silver, gold, copper, and cadmium, or alloys thereof.

In another aspect of the presently described embodiments, the corner cube reflector material incorporates a smooth and washable surface facing the irradiation target item.

In another aspect of the presently described embodiments, an acceptance angle for the corner cube array is ±45°.

In another aspect of the presently described embodiments, the irradiation treating or processing method comprises irradiating the target item using an irradiation source in an irradiation zone, and reflecting irradiation, which is one of reflected from, scattered from or transmitted through the target item, back to the target item using proximate corner-cube array reflector material defining at least partially the irradiation zone.

In another aspect of the presently described embodiments, the irradiation is for the purpose of at least one of heating, drying, curing and dehydrating the target item.

In another aspect of the presently described embodiments, the irradiation arrangement is implemented within a cooking oven or a processing oven.

In another aspect of the presently described embodiments, the target item is a food or organic item.

In another aspect of the presently described embodiments, the method is implemented within a bottle forming system.

In another aspect of the presently described embodiments, the target item is a plastic bottle preform.

In another aspect of the presently described embodiments, target material is one of metal, glass or plastic in a manufacturing or filling process.

BRIEF DESCRIPTION OF THE DRAWINGS

FIGS. 3(a)-(c) are illustrations of sheets or arrays of corner cube reflector material.

FIGS. 7(a)-(d) are illustrations of a portion of an irradiation zone of a system according to the presently described embodiments.

DETAILED DESCRIPTION

Figure 1:
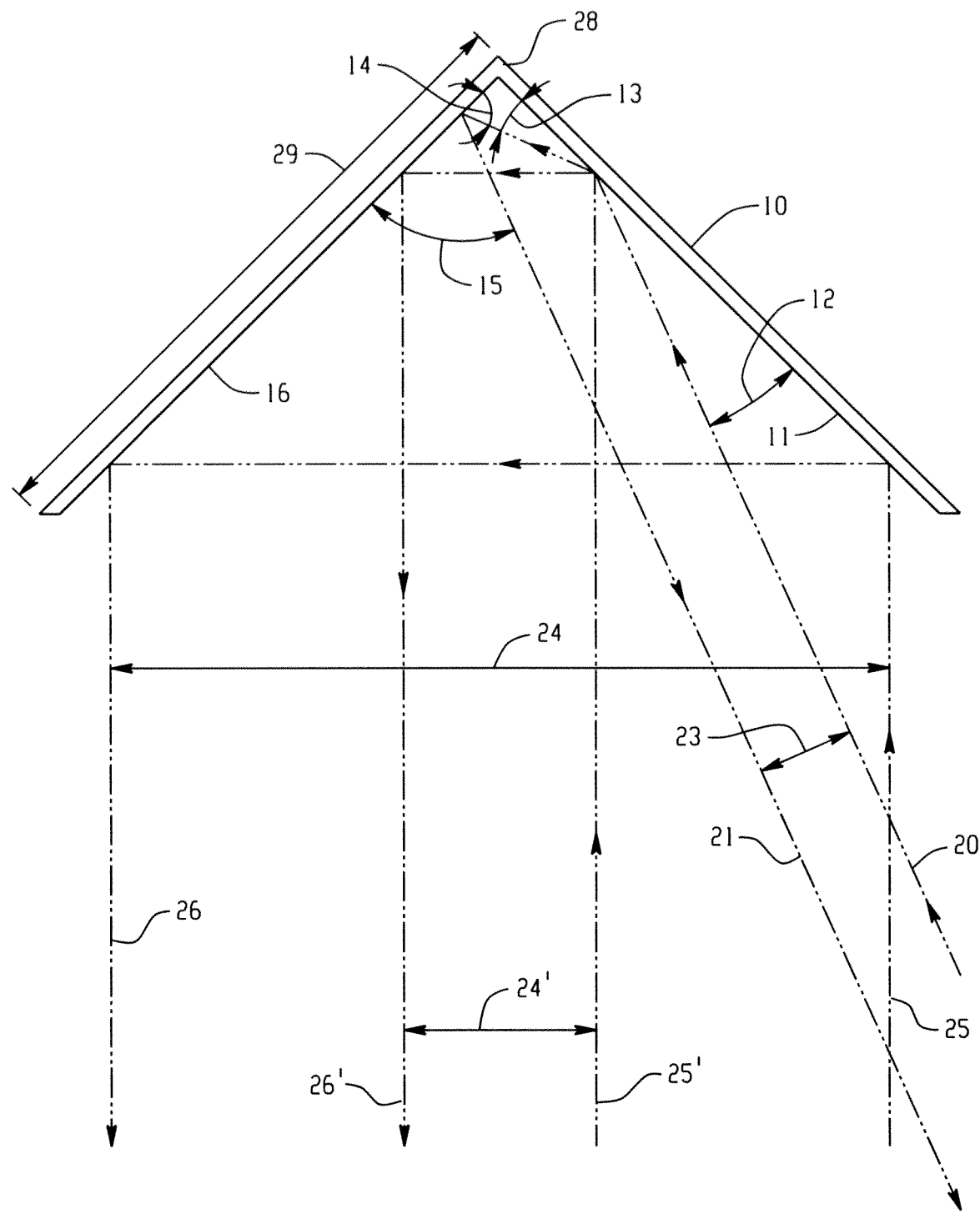
FIG. 1 is an illustration of a corner reflector.
Figure 2D:
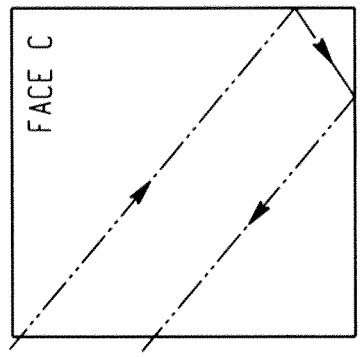
FIGS. 2(a)-(d) are illustrations of a corner cube reflector.
Figure 2B:
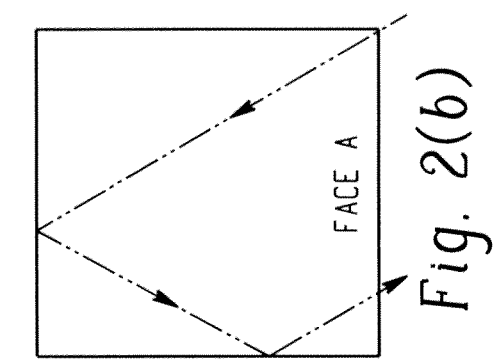
Figure 2C:
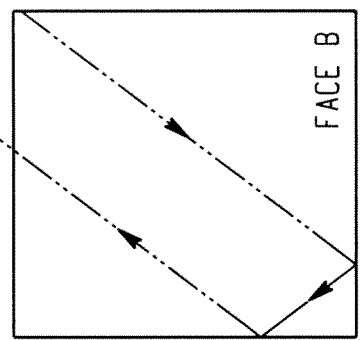
Figure 2A:
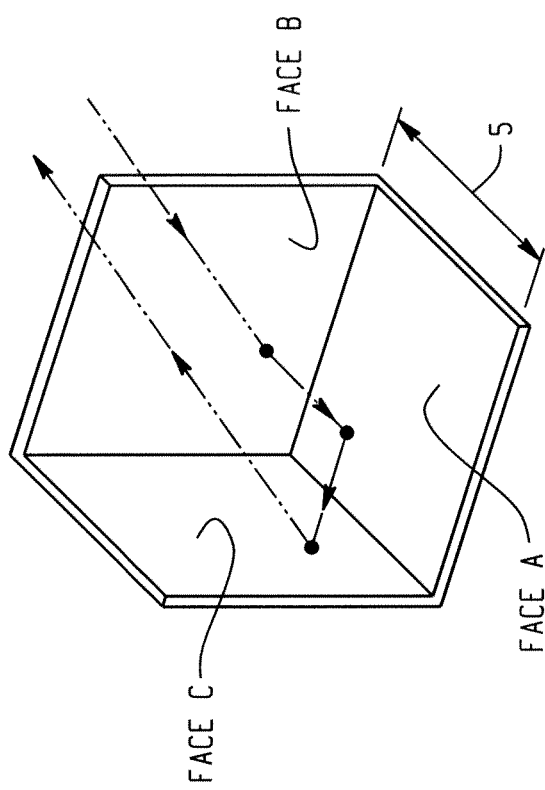

The present exemplary embodiment is a novel technique for improving the irradiation efficiency in systems where a target item is being actively irradiated, e.g., for irradiation treatment and processing.

The present exemplary embodiment is comprised of teaching and implementing novel ways of using corner-cube reflector technology for irradiation control in direct radiant heating systems. It has application in many types of direct irradiation heating systems and is especially applicable to narrowband or other directed irradiation heating systems such as broadband directed irradiation heating systems. It is especially applicable to highly directed irradiation applications where the irradiation source may be an array of semiconductor devices such as LEDs or laser diodes. For example, the irradiation sources emit radiation at one or more of a plurality of wavelength distributions of radiation including infrared, microwave, UV, and the like wavelengths at a power greater than 500 mW depending on the application. The target items in such a system may be food items (or other organic items) which are being cooked or processed, items that are being dried or cured, or thermoplastic components (such as, for example, plastic (e.g. PET) bottle preforms) that are being heated for further processing. Also, the target items could be any target material of metal, glass or plastic in a variety of environments including a manufacturing or filling process. The range of target applications is quite large but the commonality is that the efficiency of irradiation is typically an important design goal in all of the systems. The purpose and result of the implementation of the exemplary embodiment is to improve the overall system efficiency through the redirection of photons back to a targeted item which is being treated or processed with the irradiation energy. The treatment or processing of the target item includes, for example, heating, drying, curing, dehydrating, treating, coating, and the like. In order to understand the details and value of the exemplary embodiment and how to implement it, it is necessary to teach the fundamentals of irradiation systems and of corner-cube reflection technology.

A well designed direct irradiation system should have the photonic energy focused well enough that a very high percentage of the energy hits the food or targeted item to be heated directly or absorbed within the item and on the first pass. The source can include a large range of direct and active irradiation devices which produce electromagnetic radiation useful for processes described herein such as heating, drying, curing, dehydrating, coating or treating (or the like) a target. A partial list would include high intensity discharge lamps, arc lamps, quartz lamps, halogen lamps, Calrods, LEDs, light emitting transistors (LET's), semiconductor lasers including surface emitting laser devices, solid state lasers, other types of lasers, and the like. Some sources that could be used in implementation of the present embodiments are disclosed, for example, in U.S. Pat. No. 7,425,296; U.S. Ser. No. 11/448,630, filed Jun. 7, 2006; and, U.S. Ser. No. 12/135,739, filed Jun. 9, 2008, such patent and/or applications being incorporated herein by reference in their entirety. Some sources are far more directable or aimable than others. Certainly, there are many combinations of lensing, reflectors, refractors, difractors, light pipes, fiber optics, and various other means for shaping the radiation energy such that it strikes the target with the desired pattern, angles, and intensities that will be most desirable for the application. Whether it requires highly engineered beam shaping or whether the native irradiation device can produce an acceptable irradiation pattern in its most fundamental form, the challenge is still how to get the back-scattered, reflected, or through-transmitted photons back to the targeted item.

Assuming that the irradiation source engineering was done properly, a substantial portion of the irradiation energy will hit the target and, in many cases, be absorbed by the target. Although, as mentioned above, many of the photons of irradiation that strike the target item are either reflected, transmitted through, or back-scattered and are not absorbed by the target item. Subsequently, from an engineering standpoint, the target can be considered much like an active source. Thus, instead of having highly directed energy coming from a specifically engineered, active irradiation source, we have substantially diffuse energy emanating from the target item itself, even though it originated at the "active" irradiation source.

Back-scattered energy can be highly diffuse and may approach perfect randomness in terms of the vectored direction of the photons. Whereas, through-transmitted photons would typically have a much more predictable directionality but may still have a high component of randomness depending on the material, as they exit the backside of the target. Both of these situations have one thing in common. The energy "seems" as though it is emanating from the target material itself and can be treated as such for purposes of implementing this exemplary embodiment. Further, this randomness is contrasted to reflection from a specular target, for example, where the angle of reflectance equals the angle of incidence—thus defining a situation where a single reflector could be strategically placed to reflect photons back to the target. The presently described embodiments further address the much more random nature of back scattered or randomly transmitted energy described herein.

Although we are dynamically and actively irradiating the target, the target is re-emitting the photons as though it is the primary source. Because the target material is acting like a randomizing, secondary emission source for the photons, the engineering challenge is to direct them back to the source which then puts the photons back into the target where they can have further usefulness. A novel solution to this challenge is to properly position corner-cube reflector material so that it returns the photons back to the target.

Various forms of corner-cube reflectors have been well-known for many decades. Corner-cube reflectors have been used for a wide variety of applications, but have not been adopted for use as contemplated herein in the active radiant heating industry. This present exemplary embodiment envisions and teaches a novel use for the corner-cube reflector technology. It will most often be practiced with various forms of sheet corner-cube retro-reflector technology where the sheet comprises an array or arrays of corner cube reflectors or elements.

To understand the corner-cube reflector principle, it is helpful to understand the basics of a two dimensional corner reflector. FIG. 1 shows the effect a two dimensional corner reflector, having two mirrors or reflective surfaces at right angles to one another, has on a photon, which is represented in the figure as a ray vector, traveling in the plane that is perpendicular to both reflectors. Such arrangement will always include a pair of reflections. The principle that the angle of incidence equals the angle of reflection holds true with these reflections. If the photon (as shown by path 20) strikes the first mirror surface (11) at a steep angle (12), it will be reflected at the exact same angle (13). The photon will continue on its path and hit reflective surface (16) at a steep angle (14). It will then be reflected at the same angle (15) relative to the plane of the reflector and its final path after leaving the corner reflector assembly of FIG. 1 will be parallel to the input ray (20) as indicated by vector (21). The sum of the four angles (12, 13, 14 and 15) will always be 180 degrees, and the sum of incidence angle (12) and final reflectance angle (15) will always equal 90 degrees. Any ray entering the corner reflector arrangement shown in FIG. 1 traveling in the co-perpendicular plane of the mirror surfaces, will therefore always be reflected back exactly parallel to the input photon ray vector.

It is important to note that while the photon's reflected path out of a corner reflector is parallel to the original path, it does not overlay nor describe the exact same path resulting in a offset dimension (23) between the input and output parallel rays. The distance (23) between the two vectors is a function of both the size of the corner reflector and where, within the corner reflector, the photon has its first incidence. Simplistically, the further from the common corner that the ray hits the first mirror or reflectance surface, the greater the dimension (23) will be between the input and output ray paths.

A corner reflector functions as described above in two dimensions and is effective when the input photon ray is travelling in a plane which is perpendicular to both reflective surfaces.

A true corner-cube reflector, which is sometimes called a "corner reflector" or "retroreflector", adds a third reflective or mirror surface such that the planes of all three reflective surfaces are perpendicular to one another. As is shown in FIGS. 2(*a*)-(*d*), three planes Face A, Face B, and Face C are perpendicular to one another and intersect at a common point and is often viewed as a complete cube. The reality is that only three of the reflective surfaces that comprise the cube are necessary for each individual photonic reflection. The difference between the two dimensional corner reflector and the three dimensional corner-cube reflector is the following. The two reflective surfaces that are included as shown in FIG. 1 will only reflect the photonic ray back toward the sending source, parallel to the incoming photon vector path with the offset dimension (23), if the input ray is travelling in the plane that is perpendicular to both reflectors. However, a corner-cube will reflect the input photonic ray back as a parallel output ray when the input ray is at any input angle within the maximum 90° acceptance arc. Similar to the two dimensional corner reflect, the size of the offset dimension between the input and output parallel rays is a function of both incidence location and dimensions of the three dimensional corner-cube reflector. A corner-cube reflector must, therefore, be sized properly for the application at hand in order to be effective. If it is desirable to have the photonic ray nearly retrace its own path with a very small dimension (23) (from FIG. 1), the corner-cube must be quite small in terms of its physical dimensions. For the photon to return back precisely enough to the original target, it may be advisable to use sheets of very small or even micro-sized corner-cube arrays.

The advantage of the corner-cube functionality is that if the corner-cube reflector is sized and positioned properly it can return photons directly to their "source" regardless of the input angle. The present exemplary embodiment envisions and teaches ways of utilizing the corner-cube functionality to dramatically increase the efficiency of target-aimed irradiation systems. It envisions deploying appropriately sized arrays or sheets of small or micro-sized corner-cube reflectors in systems which are intended to heat, dry, dehydrate, or treat a targeted item or product with a form of direct photonic irradiation. Effectively, a properly designed system employing this exemplary embodiment may employ hundreds to hundreds of thousands or more of corner-cube devices.

Corner-cube reflector technology is available in a range of different forms. The simplest form of corner-cube reflector technology comes in the form of a single three plane reflector or a single cube. As mentioned above, the three reflection planes (e.g. Face A, Face B and Face c of FIGS. 2(a)-2(d)) must be perpendicular to one another and, at least the extension of the reflective planes, must meet at a common right angle corner. Often, because of structural or manufacturing efficiencies, this reality is met in the form of a three dimensional cubic structure. While this single corner-cube reflector is used for many purposes such as laser distance measuring and radar buoys, it is not terribly useful for the present exemplary embodiment. For example, a three dimensional cubic structure results in a relatively large offset distance between the parallel input and output rays which would decrease the efficiency of target-aimed irradiation systems.

This offset distance is represented as 23 in FIG. 1. It represents the distance from input ray (20) to output ray (21). A photonic ray (25), represented in FIG. 1 as hitting the reflector further from a right angle corner (28) and ultimately reflected as a parallel ray (26), has a distance (24) represented between the two parallel photonic rays. The general rule is the closer to a corner (28) that a input ray such as (20) or (25) is reflected, the smaller the offset distance such as (23) or (24) will be to a parallel output ray. Another example is shown by input ray 25', output ray 26' and dimension 24'. If it is desirable for a specific application and target size for the distance from the input photonic ray to the output photonic ray to be minimized, the first reflection must be close to the apex of the reflectors such as (28). In practice, this means that the dimension of the cube or reflector (5, from FIG. 2(c)) or (29, from FIG. 1) respectively, must be as small as is necessary for the application. Obviously, if there is only a single cube reflector, it could make it a very small target to hit so the solution is to provide an array of small cubes optically contiguous to one another. The smaller the dimension of the cubic reflectors, the more nearly the array will reflect the photonic ray back to a spot very close to its origin.

A wide range of corner-cube reflectors are available and are manufactured commercially. Their most typical application is for use as a retro-reflector in conjunction with sensors. Sheets of corner-cube reflection material comprising an array of a plurality of corner cube reflectors or elements are manufactured in glass, plastic, and other reflective materials. The practice of this exemplary embodiment involves arrays of corner cube material which can cover substantial physical areas proximate to the irradiation zone. In some forms, the corner cube sheet material having the arrays of corner cube reflectors will define a zone or cavity where irradiation occurs such as in an oven or heating cavity or chamber. A general guideline for implementing this technology is to ensure the corner cubes are sufficiently small to return the irradiation energy back to the desired location. Since the absorption of radiant energy is a function of path length of material, using thinner corner cube material sheets will lead to less heating of the corner cube material. There is also an advantage to having the material be thin—which implies that small or micro sized corner cubes be embedded in the sheet material. This helps to optimize both the precise return of photons to the point from which they left the target as well as the heating that takes place in the corner cube sheet material.

For many applications it is desirable to have a smooth, scrubbable or, at least, easily cleaned flat surface on the face of the corner cube material facing the target items. Therefore, instead of using material which is three-dimensional on the side facing the target items, it is desirable to manufacture it with a smooth and easily cleanable or washable face toward the target items. With reference to 3(a) (which for ease of reference and illustration shows a representative view of a cross-section of a portion of sheet array 200), a three-dimensional shape for a corner-cube sheet array 200 is manufactured into the backside of the corner cube sheet material 210. The corner-cube sheet array 200 can be manufactured using molding, etching (such as photo-etching), coating, casting and the like technologies and may be formed in suitable arrays or sheets. A ideal reflective coating surface 240 is placed on the backside 230 of the sheet 210, where it will not be contaminated by splatter from the target item or any result of the irradiation process. The back is then be coated with silver, aluminum, gold, copper, cadmium (or alloys of silver, aluminum, gold, copper or cadmium) or other coating material that is the best for the wavelengths range that is anticipated for a particular application. For example, the corner cube material can be coated on its back surface to be a suitable, e.g. an excellent (reflects 95% of the irradiation), reflector of wavelengths above 1600 nanometers or a suitable or good (reflects 85% of the irradiation) reflector of wavelengths above 750 nanometers. For example, in the short wave infrared range, about 1600 nm, silver is typically the most ideal, practically available reflective material. For example, silver coating is approximately 98% reflective in a range of approximately 1600-1700 nanometers, which is particularly useful for preform (e.g. PET preform) heating applications. Aluminum is a reasonable reflector material, but is not ideal for some wavelengths. By molding the corner cube reflector sheet material 210 as indicated above e.g. out of material which is optically as transmissive as possible at the wavelengths which will be used, it allows the flexibility of coating the back with the best choice of reflective material 240. The corner cube reflector sheet material 210 also facilitates coating, as an option, the smooth front surface 220 with a refractive index matching coating 250 of choice. By choosing the correct coating 250 on the front surface, it is possible to maximize the percentage of photons which are reflected from the front surface versus the number of photons which penetrate to the corner cube reflection of material thus hitting the chosen reflective material on the backside surface. For example, an index of refraction matching coating may allow for better penetration of the flat front surface (e.g. less reflection) by reflected irradiation to allow for more rays to strike the corner cube arrays. The acceptance or critical angle on this front flat surface 220 should also be considered in the implementation. For pseudo-monochromatic applications, it is possible to choose matched coatings which will facilitate reflection of less than 1 or 2% from the front surface of the sheet material or less. Several layers of coating can be used to ensure that each of several wavelengths that might be used is prevented from front surface reflection as well. It is also possible to use coatings which are completely reflective at one wavelength or set of wavelengths and completely transmissive at another. This could allow the corner cube reflection material to be a true retro reflector at some wavelengths while functioning as a simple flat mirror surface at other wavelengths. It is also possible to add coatings which are aesthetically pleasing to the human eye but which are absolutely transparent to nonvisible wavelengths. For example, if the inside of an oven were lined with corner cube reflective sheet material which had a blue coating on the surface, it could still be completely invisible and transparent in the near infrared (NIR) or short wave infrared (SWIR) wavelength ranges. In addition, coatings that serve as an anti-bacterial layer may be used on the flat surface 220. Nano-coatings may also be used to perform various functions. Further, material that is conducive to self-cleaning functionality may also be used.

Alternatively, the glass or plastic material out of which the corner cube reflector sheet material 210 is molded or manufactured could also have a colored pigment in it to make it appear as a color and, in some cases, appear aesthetically pleasing to a human viewer such as the consumer. If an appropriate colorant is employed, it similarly could be completely transparent outside of the visible range. In this case, for example, the corner cube material would still function as corner cube material at desired wavelengths. Of course, any coatings or colorant which is used in the manufacture of such a product must be suitable for use with the application including food and consumer safety issues. This color would make it possible for the interior of an oven to be made a color that is aesthetically pleasing to the consumer while being safe and easy to clean and comprised of completely functional corner cube reflection material. This combines high systemic efficiency with cosmetic beauty in a very functional configuration.

Figure 3A:
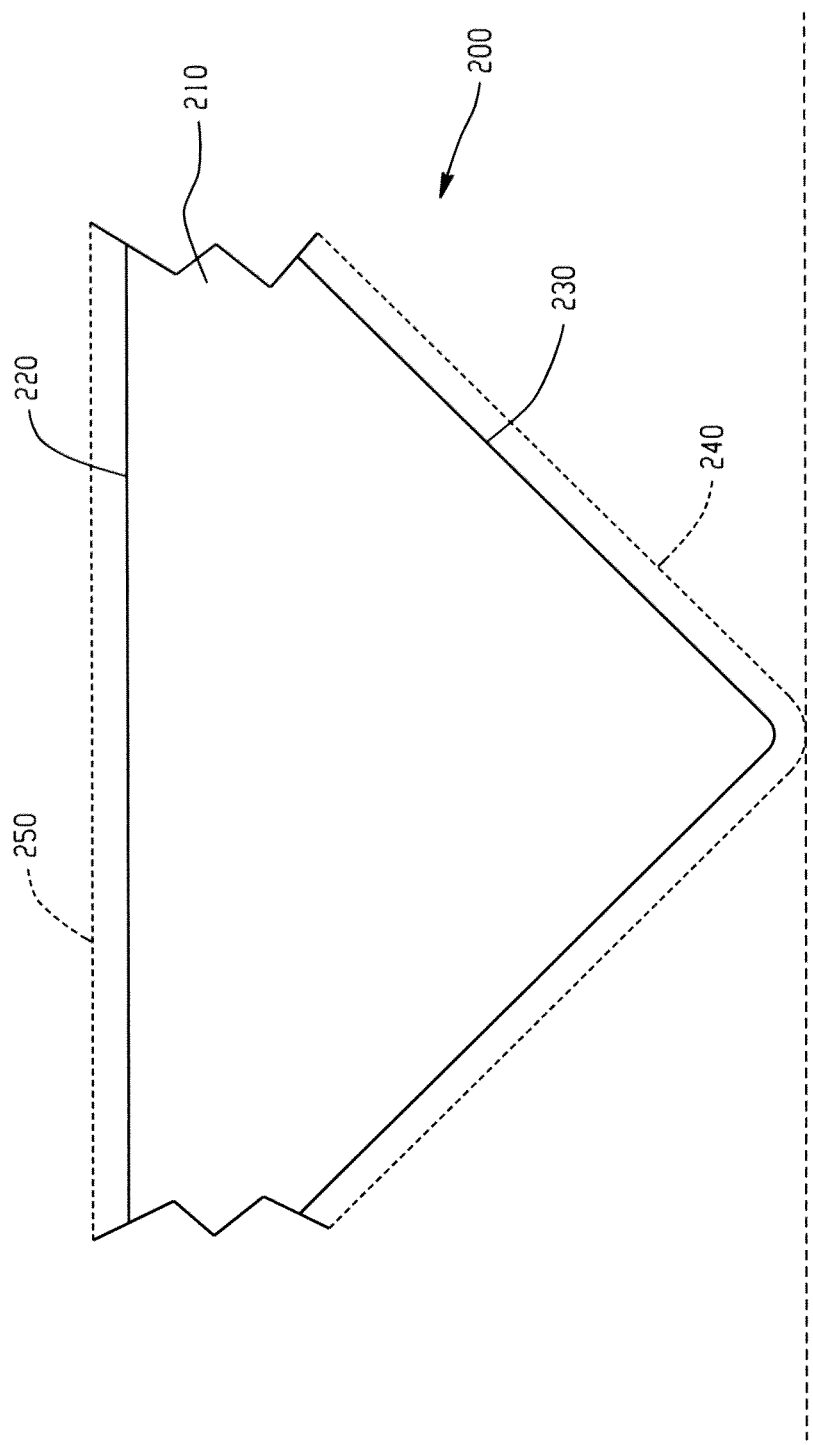
Figure 3B:
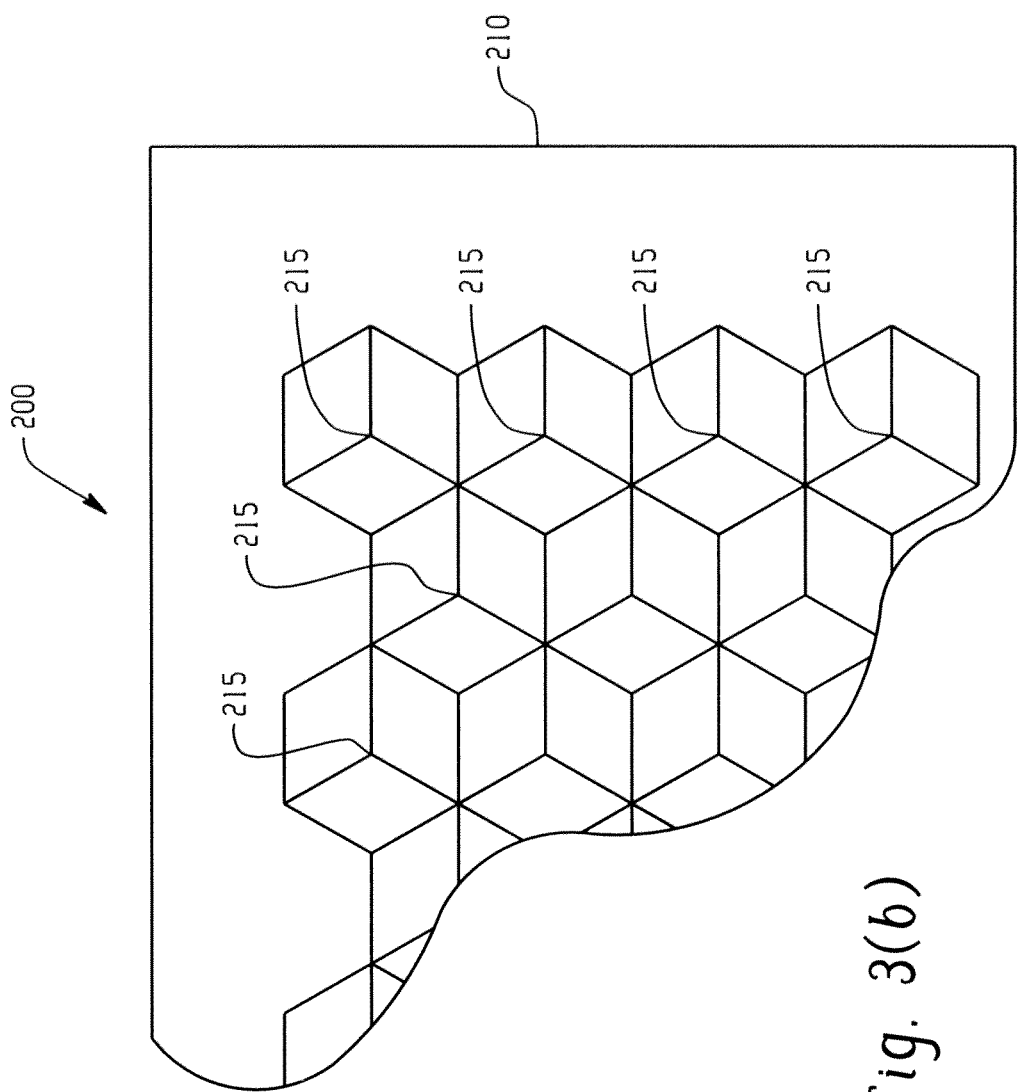

With reference to FIG. 3(*b*), the sheet of corner-cube material 210 having a corner-cube sheet array formed is illustrated from a top view. As shown, a portion X by Y array (e.g. where X and Y are greater than 1) of corner-cube reflectors (such as those designated by 215) is shown. The size and configuration of the array will vary from application to application.

There are further considerations in the proper application of corner cube array material. Sometimes, it is necessary to have the dimensions of the corner cubes sized larger so that the energy specifically does not get returned precisely to its source. A good example of this is when irradiating with laser diodes which typically have very sensitive emission facets which can be damaged by a return of the energy back onto the face of the facet. This can cause an overheat failure of the facet. If the photonic energy from the laser diodes source does not hit the target first but rather directly hits the corner cube reflection material, it could be reflected straight back to the facet and cause substantial damage. With normal corner cubes, even if the size of the cubes is larger, some percentage of the photonic energy will be directed near the apex or junction (intersection) point of the three mirrors. Locally, as the photon strikes near the apex, it acts the same as a tiny corner cube reflector which will return its energy back very closely to the source. The distance is a function of how close the reflection is to the apex of the three reflective surfaces. This is shown for example by distance 37 and 33 in FIG. 3(*c*), which will be described in greater detail below.

A modulation of the standard corner cube geometry allows for an elegant solution to this potential problem. If the corner cube is manufactured so that the portion of the cube which is strategically close to the apex is not reflective, the problem of precise retro reflection which could damage a source, or is undesirable for some other reason, can be avoided. This could be accomplished by changing the geometry of the corner cubes nearest the apex or by changing the materials or the coating(s) that are employed. The actual corner of the cube could simply be cut off or eliminated in the manufacturing process at a random angle, preferably at a plane which is close to orthogonal to the theoretical diagonal line through the cube. Another way would be to change the surface finish on all three mirror surfaces near the apex such that it became a poor reflector at the wavelengths of the application. Yet another way would be to eliminate the reflective coating which may be added to the appropriate side (either inside or outside surface) of the cube, thus making it a non-reflector near the apex. Certainly, combinations of various techniques for making it nonreflective near the apex could be devised that would serve this function. This will reduce the systemic efficiency of photon recycling back to the target but it may be an appropriate price to pay to protect the source(s) or for some other reason. If the face of the facet is small relative to the cube size being employed, then cross-sectionally, only a small amount of surface area near the apex will need to be made nonreflective. Since the efficiency of recycling the photons back to the target is a function of the cross-sectional reflective surface area of the cube from the vantage point of the target, the effect of eliminating a small near-apex area could be a minor percentage of the whole surface area of the corner cube reflection sheet.

The exact type of material chosen for the implementation of this exemplary embodiment for a particular application must be appropriate for the end use and environment. For example, a glass corner-cube sheet may be more sanitary, handle the heat range, and be easier to clean deployed in a cooking oven appliance. Plastic may be cheaper and more durable in some other applications.

The present exemplary embodiment teaches the novel practice of strategically positioning corner-cube reflector materials (e.g. sheets of material comprising arrays of corner cube reflectors or elements) to increase the efficiency of directed radiation heating systems. According to the present exemplary embodiment, the corner-cube reflector material would be used to define or line all or a strategic portion of a directed irradiation heating, drying, curing, dehydrating, or cooking system. For example, half of the enclosure or cavity or zone, more than half of the enclosure or cavity or zone, substantially all of the enclosure or cavity or zone, or all of the enclosure or cavity or zone (with the exception of possibly the space or gap provided for the irradiation source) may be defined or lined with the sheet material. A directed irradiation heating or cooking system is defined as a system which directs or 'points' radiant photonic energy specifically and directly at a target which is being heated, cooked, cured, dried, dehydrated, coated or treated or processed with the radiant energy. The exemplary embodiment is even more applicable to narrowband irradiation systems whereby the direct photonic radiant energy can be even more precisely aimed at a heating target or a sub-portion thereof. Many times it is desirable for a direct irradiant heating system to heat a target work piece according to a specific thermal profile or pattern as opposed to evenly or homogenously. In such heating systems, the present exemplary embodiment can redirect much of the photonic radiant energy directly back to the point from which it scattered from the surface of the target or the point from which the energy exited after passing through the target. Along these lines, for example, sheets of reflector material may also be strategically located in at least some areas where stray radiation would be likely to need redirection to the target item.

Since corner-cube reflector sheets have a maximum acceptance angle, it is important to work within the parameters of the sheet designs. Most corner-cube retro-reflection materials, unless specially designed for wider acceptance angle, have an acceptance angle of plus or minus 45° to an orthogonal line relative to the front plane of the corner-cube reflection sheet or panel. Generally, the geometry of the cubes themselves dictate that a total included angle of 90° is the absolute maximum acceptance angle. From a practical standpoint, it is often substantially less than 90° or ±45° for efficient reflection. While it is possible to design corner-cube reflector sheets that have a non-orthogonal axis of reflection which is angled one direction or another, most of them are configured so that the central reflection angle is orthogonal to the large plane of the sheet. If the corner-cube reflector panel is designed with randomized orientation of the corner-cube reflector elements which comprise the sheet, then it will reflect a wider selection of input ray angles, but will also sacrifice of overall reflection efficiency. In other words, some percentage of the incoming photons will not be properly reflected back in a path parallel to their incoming ray path. This is useful if it is desired to have a more diffuse reflection if the application demands it. Sometimes it is designed to have nearly 100% reflection near the orthogonal axis but less efficient reflection as the input vector is further off axis.

To illustrate, with reference to FIG. 3(c) and sheet 200, the acceptance angle of ±45° (for a sheet of corner cube material or array) relative to the noted orthogonal line L is shown by input rays 32 and 35. At the acceptance angle shown (e.g. where angles 34 and 38 are greater than 45°), the output rays 31 and 36 result, respectively. The dimension 33 (e.g. parallel distance between input ray 32 and output ray 31) and the dimension 37 (e.g. parallel distance between input ray 35 and output ray 36) evidence an acceptance angle as contemplated. In contrast, where the acceptance angle is greater than 45° from the noted orthogonal line L (e.g. where angle 42 is less than 45°), an input ray 40 results in an output ray 41 reflected at an angle 43 from the input ray. An output ray parallel to its input ray is not realized in these circumstances, but a more diffuse output is realized.

To the extent that the corner-cube reflection material is properly configured and positioned so that the photonic reflections will reach the material within the 90° total included angle for photon acceptance, the exemplary embodiment has the advantage of dramatically increasing the overall photonic utilization efficiency of a radiant system.

It has further advantages with a system which can precisely aim irradiation energy at subsections or specific portions of a target.

It has particular utility when used in a direct irradiation heating system which is irradiating a target which is at least partially reflective or creates some amount of back-scatter of the directed energy.

It has another advantage of being directly advantageous for applications where the directed energy passes through the target having been only partially absorbed in the target and it is desirable to return it back to the point of the target from which it exited.

It has another advantage of being directly advantageous for applications where the directed photonic radiant energy passes through at least a first surface layer of material comprising a target and is then reflected back through that layer and will exit the target and it is desirable to return the photonic energy back to the point of the target from which it exited and use any additional photonic energy that is available.

The exemplary embodiment is particularly advantageous when irradiating a target which is intended to be non-uniformly heated according to a specific heat pattern or signature.

The exemplary embodiment has further advantages of dramatically increasing the overall energy efficiency of the irradiation system.

There are still further advantages to the exemplary embodiment by capturing and reusing photons which would have been otherwise lost to the ambient or surrounding environment, especially for the irradiation of targets which have high propensity to back-scatter.

There are still further advantages to the exemplary embodiment by returning photons which are back scattered from a target and reusing them at the desired location in the target instead of allowing them to become randomized irradiation which causes general heating.

There are still further advantages to the exemplary embodiment by redirecting photonic radiant energy which passes through a target and returning those photons back to the target according to the desired irradiation pattern and preventing them from being random radiant energy which causes generalized heating to the target.

There is yet other advantage to the exemplary embodiment in that it prevents general heating of the ambient environment and surrounding components and equipment by properly redirecting the photonic radiant energy back to the intended target.

There are other advantages to the exemplary embodiment which provide for a deeper irradiation absorption according to the desired irradiation pattern than would be possible if the photons were not properly redirected or recycled.

It has another advantage of being directly advantageous for applications where the directed photonic radiant energy passes through at least a first surface layer of material comprising a target and is then reflected back through that layer and will exit the target and it is desirable to return the photonic energy back to the point of the target from which it exited and use any additional photonic energy that is available.

Another advantage of the exemplary embodiment is that it can make a dramatic improvement in efficiency and speed of food processing ovens which are cooking, searing, broiling, baking, frying, proofing, melting, basting, grilling, steaming, boiling, or roasting.

The exemplary embodiment also has significant advantages for directed radiant heating process applications for industrial and commercial processes whereby the back-scattered or reflected photonic energy and/or energy which passes through a work piece can be redirected to the work piece at the point from which is exits the target work piece.

The exemplary embodiment has still further advantages specific to the reheating of plastic bottle preforms to return the photonic radiant energy which passes through or is reflected from a preform precisely back to the place from which it exited the preform for better heat location control and better overall systemic efficiency.

The exemplary embodiment has still further advantages in the reheating of PET plastic bottle preforms by dramatically simplifying and reducing the cost of the reheating oven by eliminating the need to have the preform completely contained in an irradiation bottle in order to efficiently utilize the produced photons.

The exemplary embodiment has still further advantages for a narrowband irradiation system which can precisely irradiate the preform according to a desired thermal pattern but with a substantially simpler irradiation system design.

The present exemplary embodiment has still further advantages of providing a simplified preform irradiation handling system while still maintaining good photonic efficiency.

The application embodiments of the present exemplary embodiment are wide and varied and will, by their very nature, be different physical configurations in order to optimize the concepts for a given use. Several examples will be shown and detailed so that one of skill in the art would be able to take the novel concepts and apply them to a variety of applications in directed irradiation systems.

Figure 4A:
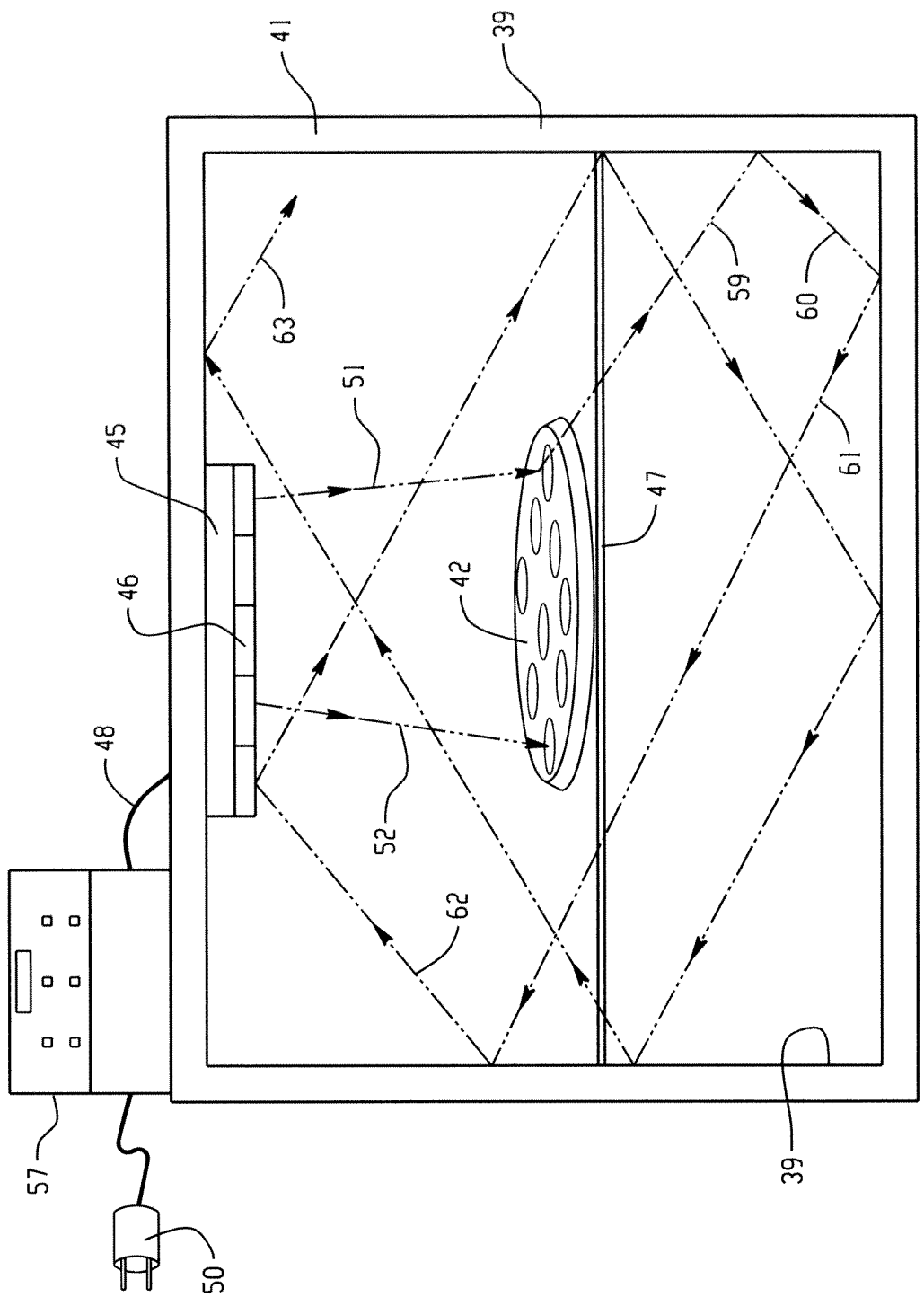
FIG. 4a is an illustration of a conventional oven.

A cross sectional view of a cooking oven is shown in FIG. 4a which is enclosed by an oven cavity (41) and is shown cooking a pizza (42) which is resting on and supported by an optically transparent shelf (47). This shelf (47) could be either a material which is nearly completely transparent to the irradiation wavelength(s) that are being used or could be a grating or mesh material which has a high percent of space between the support material through which the irradiation can freely pass. It shows a mounting arrangement (45) for an array of narrowband irradiation devices (46) that produces photonic irradiation which would be precisely directed to primarily the food item (42) which is to be cooked or irradiated. The irradiation array (45) is supplied electrical current through an electrical connection cable (48) which is supplied current controlled, electrical DC voltage from a power supply (49). The power supply (49) is connected to AC power mains by power cord (50). The power supply (49) is controlled by a control system and a user interface panel represented by (57).

As power is supplied to the array (45), the semiconductor diode irradiation devices (46) produce irradiation which exits the devices in an irradiation pattern that it is aimed at the food target (42). Photonic irradiation is schematically represented by photonic ray vectors (51) and (52). Once the photon, represented by vector (51), contacts the food (42) it will either be absorbed, reflected, or scattered. FIG. 4a shows that it is reflected as represented by vector (59). The photon represented by vector (59) strikes the oven cavity wall (39) and is reflected as indicated by vector (60) which then strikes the oven wall (39) again and is reflected as vector (61). Vector (61) strikes the oven cavity wall (39) in another location and is reflected as vector (62). This process continues for many many reflections until the photon's energy has been substantially dissipated from the reflections or until it strikes something into which it can be absorbed as represented by the dangling vector indicated by (63).

Figure 4B:
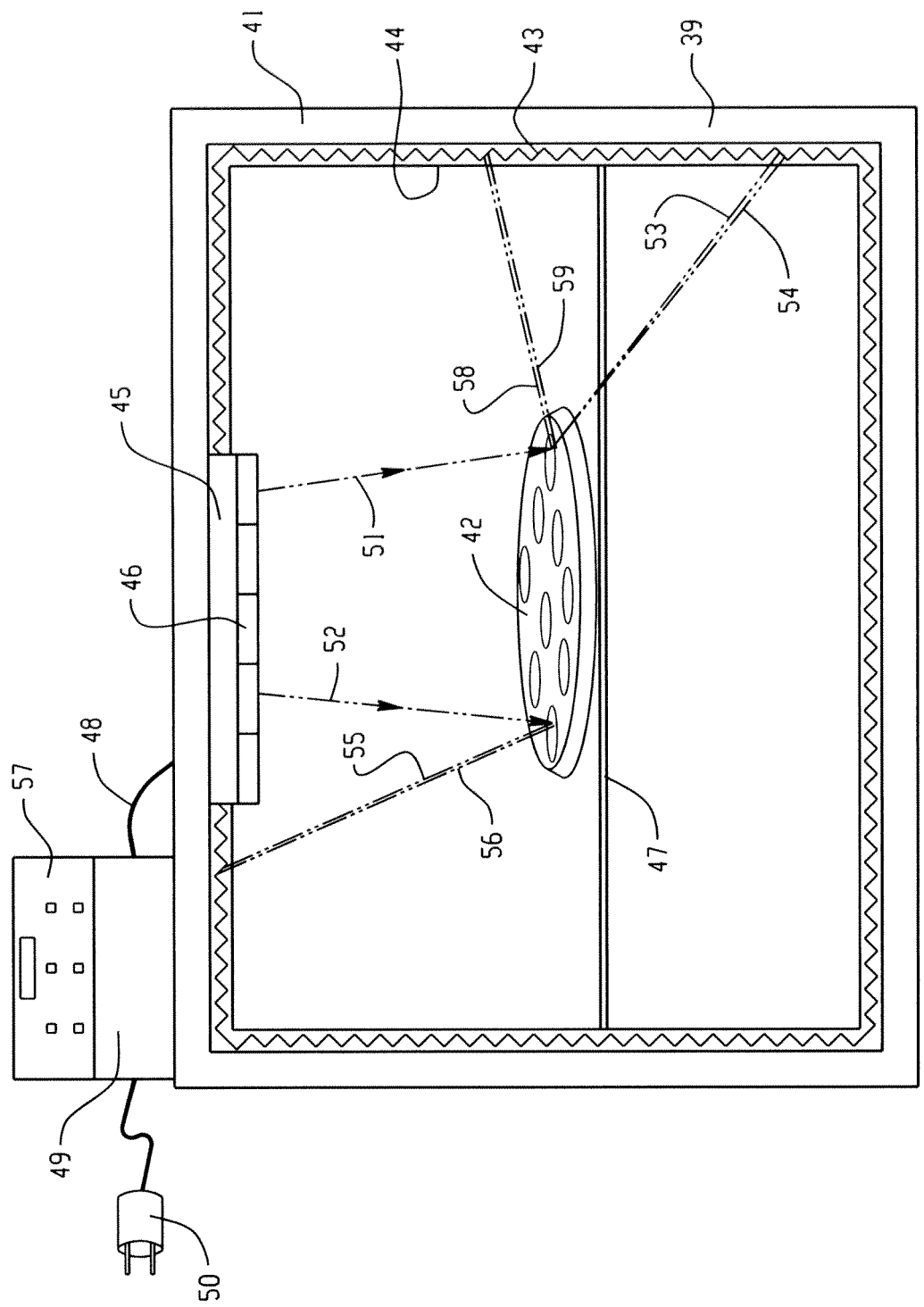
FIG. 4b is an illustration of an oven according to the presently described embodiments.

A similar cross sectional view of a cooking oven is shown in FIG. 4b, with the addition of a corner-cube lining (44) (e.g. corner cube material in sheets having arrays of corner cube reflectors or elements formed therein, as described above), which lines and defines or is enclosed by an oven cavity (41) and is shown cooking a food or organic item such as a pizza (42) which is resting on and supported by an optically transparent shelf (47). The oven cavity (41) defines an irradiation zone or chamber. The sheets of corner cube material may cover varying portions or amounts of the cavity, as noted above. It shows a mounting arrangement (45) for an array of narrowband irradiation devices (46) which would be used to produce photonic irradiation which would be precisely directed to primarily the food item (42) which is to be cooked. The irradiation array (45) is supplied electrical current through an electrical connection cable (48) which is supplied current controlled, electrical DC voltage provided from a power supply (49). The power supply (49) is connected to AC power mains by power cord (50). The power supply (49) is controlled by a control system and a user interface panel represented by (57). Also, the system may be provided with a mechanism to convey food items into and out of the oven, e.g. along a path.

As power is supplied to the array (45), the semiconductor diode irradiation devices (46) produces irradiation which exits the devices in an irradiation pattern aimed at the food target (42). Photonic irradiation is schematically represented by photonic ray vectors (51) and (52). The photonic irradiation is in a form of an appropriate irradiation pattern such that it contacts the desired portion or all of the food item (42). The irradiation ray (51) emanating from the irradiation device (46) makes contact with the food item (42). When the photon represented by ray (51) contacts the food, it will either be reflected, or will penetrate into the food and be absorbed, or may be scattered back randomly away from the food. In the example, we will assume that photon represented by ray (51) is reflected and becomes ray (53) which ultimately strikes the outer surface of the corner-cube reflection material (44) which is transparent at that wavelength to the photon represented by ray (53). The photon will continue into the corner-cube reflection sheet material (44) until it strikes the actual corner-cube reflector surfaces (43) which are in the interior of the sheet corner-cube reflector material. Because of the nature inherent to corner-cube reflection material, the photon is then reflected back on a path represented by ray (54) until it again contacts the food material (42). When the photon contacts the food material (42), we again have a probability function as to whether the photon will be absorbed, reflected, or scattered. If the photon was reflected or back-scattered and did not enter the food material to be absorbed, it would proceed along a path indicated by ray (59) and upon hitting the reflection surface of the corner-cube reflector (43) would again be reflected back toward food material (42) along vector path (58). The advantage of using the corner-cube irradiation material for lining the cavity of the oven as shown in FIG. 4b is that this process can happen over and over until the photon is actually absorbed into the food or target material (42) as desired. Since irradiation photons hitting a food product typically has a 20% to 60% chance of being back-scattered, or reflected, this efficiency improvement can be very significant.

Most high volume plastic soda, water, and juice bottles today are made of polyethylene terephthalate (PET) or a similarly moldable material. A high-volume PET bottle is made as a two-step process. First, a cylindrical part known as a preform is injection molded or compression molded, a cross section of which is shown schematically in FIG. 5a. The preform has a finish area including threads (65) as well as a support ring or neck ring (66). Below the neck ring after a transition zone is the reheating zone (64). A cylindrically tapered section (72) is formed with a tapered wall thickness which ultimately ends up in the full wall thickness (68) for the so-called 'body' of the preform. The body of the preform, which is molded in a shape similar to a test tube, supplies the thick material which ultimately will be bi-directionally stretched into thin material at the full diametric size and length of the formed bottle. Such preforms provide further examples of target items to be processed according to the presently described embodiments.

Figure 5A:
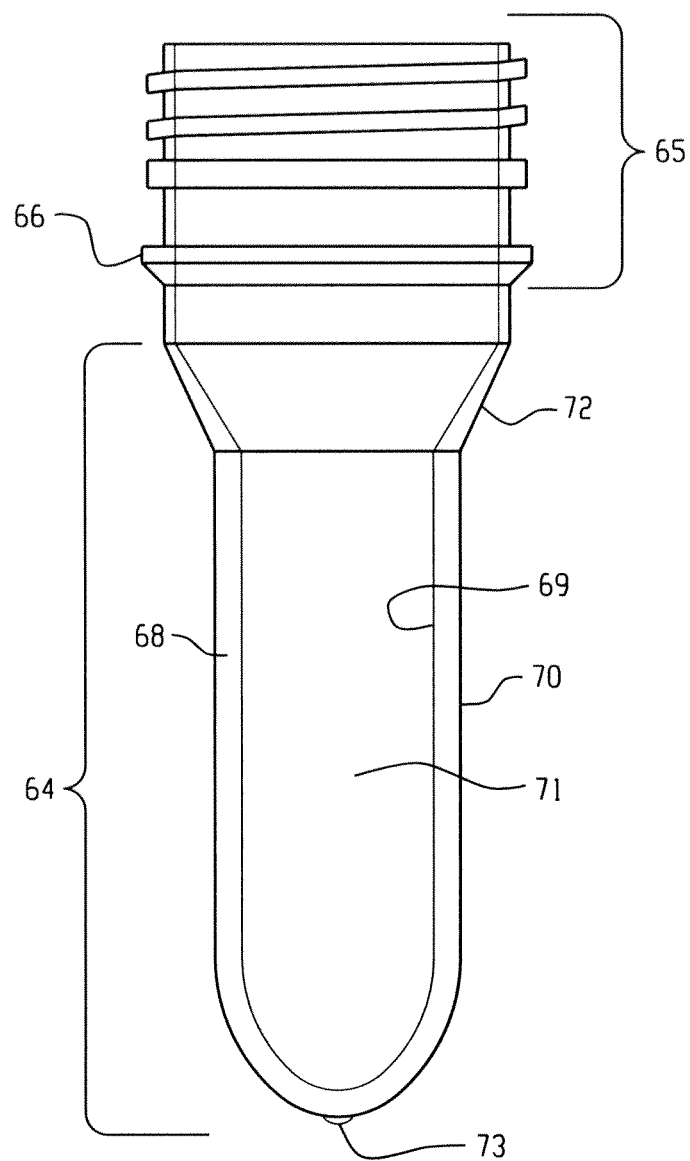
FIG. 5a is an illustration of a bottle preform.

The molded plastic material which forms the reheat section (64) must be heated to a sufficient temperature such that the plastic reaches the glass transition temperature at which it can be stretched into the final bottle form. The process involves first mechanically stretching the length of the preform body vertically as represented in FIG. 5a and then introducing a high pressure fluid (usually air) which can horizontally stretch the material into the mold which will define its full diameter and shape.

The reheat section (64) must be heated precisely enough that it is neither too hot nor too cold to allow proper plastic flow of material into the final bottle form. Although it is possible to blow a commercially acceptable bottle by heating the reheat section (64) completely uniformly, it is not often the ideal temperature profile. The ideal heating signature makes the preform warmer in areas where more forming is required and cooler in areas where less forming is required. The heating signature also heats the tapered area (72) properly so that an ideal thermal temperature gradient profile facilitates forming the bottle with the least amount of resin possible. Since the tapered section (72) inherently has a non-uniform wall thickness, an ideal irradiation heating system will allow aiming the exact right amount of energy at the precise locations where it is needed to get the non-uniform heating profile that is required. Even if uniform heat in the tapered area (72) is the best way to blow the bottle, it requires precise radiation aiming control as well as control of all reflections and transmissions.

The gate area (73) and the immediately surrounding area must also be precisely irradiated to allow for the efficient flow of the resin in that area. The ability to precisely irradiate in the area surrounding the gate area (73) and in the transition area (72) can facilitate a substantial reduction in the resin requirements to blow a bottle with high commercial quality. In fact, having the perfect temperature profile in the reheat area (64) can reduce the overall resin requirements to blow a bottle by 5-10%. Since the cost of resin represents 60-80% of the cost of a preform, getting the reheat temperature profile optimized can greatly reduce the cost for the bottle manufacturer.

Figure 5B:
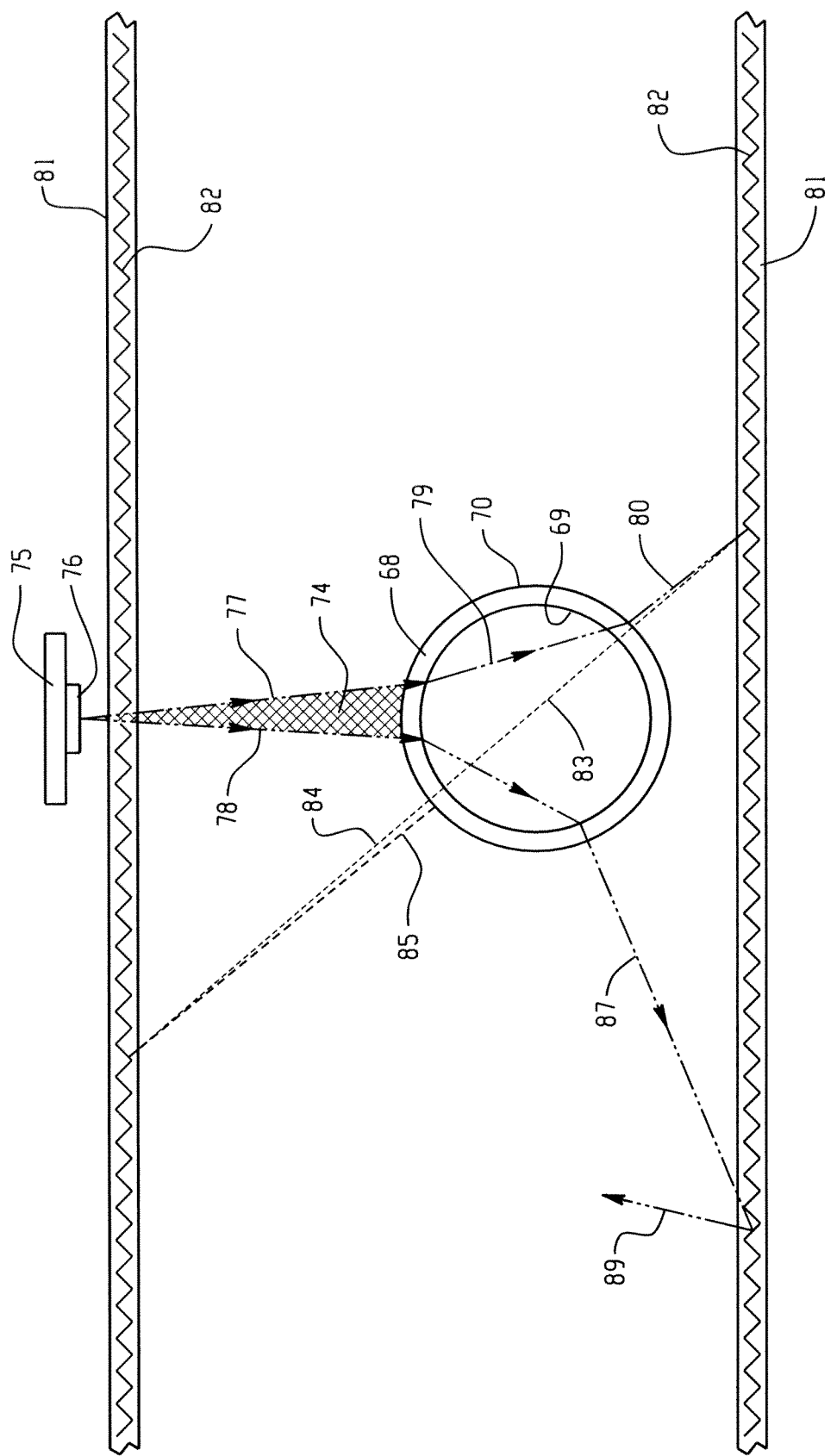
FIG. 5b is an illustration of a system for irradiating a bottle preform according to the presently described embodiments.

The irradiation of a preform in an irradiation zone or cavity or chamber of a bottle forming system from an aimable irradiation source is shown in plain view in FIG. 5b. FIG. 5b is a top cross sectional view showing the cross section of the preform body as (68) having an outer sidewall (70) and an inner sidewall boundary (69). Although a variety of aimable irradiation sources could be used, FIG. 5b shows an irradiation array mounting board (75) on which are mounted semiconductor irradiation devices (76). The irradiation devices (76) produce irradiation in an outward pattern which is directed toward the preform (68) as indicated by the cloud of photonic irradiation energy (74) generally shown between vectors (77) and (78). Vector (77) represents the path of a photon which strikes the outer wall (70) of the preform body and penetrates into the sidewall (68) depositing some of its energy (e.g., is absorbed) as it passes through the sidewall (68). For purposes of this illustration we are assuming that the photon represented by (77) entered the sidewall, but in some cases might have been reflected from the sidewall at its point of impact. In the case of PET plastic being irradiated at the right wavelength, a small percentage of photons are typically reflected or scattered upon initial impact. Since greater than 95% of the photons would penetrate into the wall with PET material, we will assume that it will follow that more typical path. The exact optical path that would be dictated will be ignored for purposes of illustration of the principle of the present exemplary embodiment. If we assume that its energy was not exhausted as it passed through the sidewall (68) and exited at the inner sidewall (69) to the interior space of the preform, it will continue along a path (79) until it strikes the inner sidewall (69) and then will proceed through the wall thickness (68) until it exits at the exterior wall (70) and continues as indicated by vector (80) until it makes contact with the corner-cube reflector material (81) (e.g. sheets of arrays of corner cube reflector material, as described above) and the actual reflection surfaces (82). The tight parallel return ray will follow a line as shown by the dotted line closely parallel to (80) and it will reenter the outer wall of the preform (70) pass through the wall of the preform (68) while it deposits heat energy and if it has not exhausted all of its energy it will depart from the preform at the inner wall (69) and will follow the vector path (83) until it strikes the preform inner wall (69) again and deposits further energy through the wall thickness (68) until it again exits at the outer wall (70). This process of reflection back to the origin will continue as it follows the vector path (84) and eventually reflects off the corner-cube reflection surface (82) which will return the photon on the path (85) back to the preform once more. This process can continue as many times as is necessary until the photon deposits all of its energy into the target preform material or in the corner-cube reflectors themselves. By properly positioning the corner-cube reflector material (81) a substantial gain in efficiency can be facilitated versus using traditional reflectors.

The sheets of corner cube reflector material may be located circumferentially around the long axis of the preform and allow for access for transport of the preforms in and out of the irradiation chamber or zone to facilitate high speed processing. Such a configuration results in the corner cube reflector material forming the irradiation chamber or zone for at least part of the time of irradiation.

Traditional reflectors are adequate for some situations but must be highly engineered for the exact dimensionality of the target and the irradiation system. With a traditional planer reflector, the angle of incidence equals the angle of reflection; it is highly unlikely that the energy will be returned back to the desired using point in the target. Even with curved or engineered shapes it is only theoretically efficient for certain geometries and component dimensions. The advantage and novelty of using the corner-cube reflector material is that it is simple to apply to the irradiation environment and as long as it is sized and positioned correctly it will recycle and reuse a much higher percentage of the stray photons that are not consumed in the target pursuant to the first impact.

Figure 6:
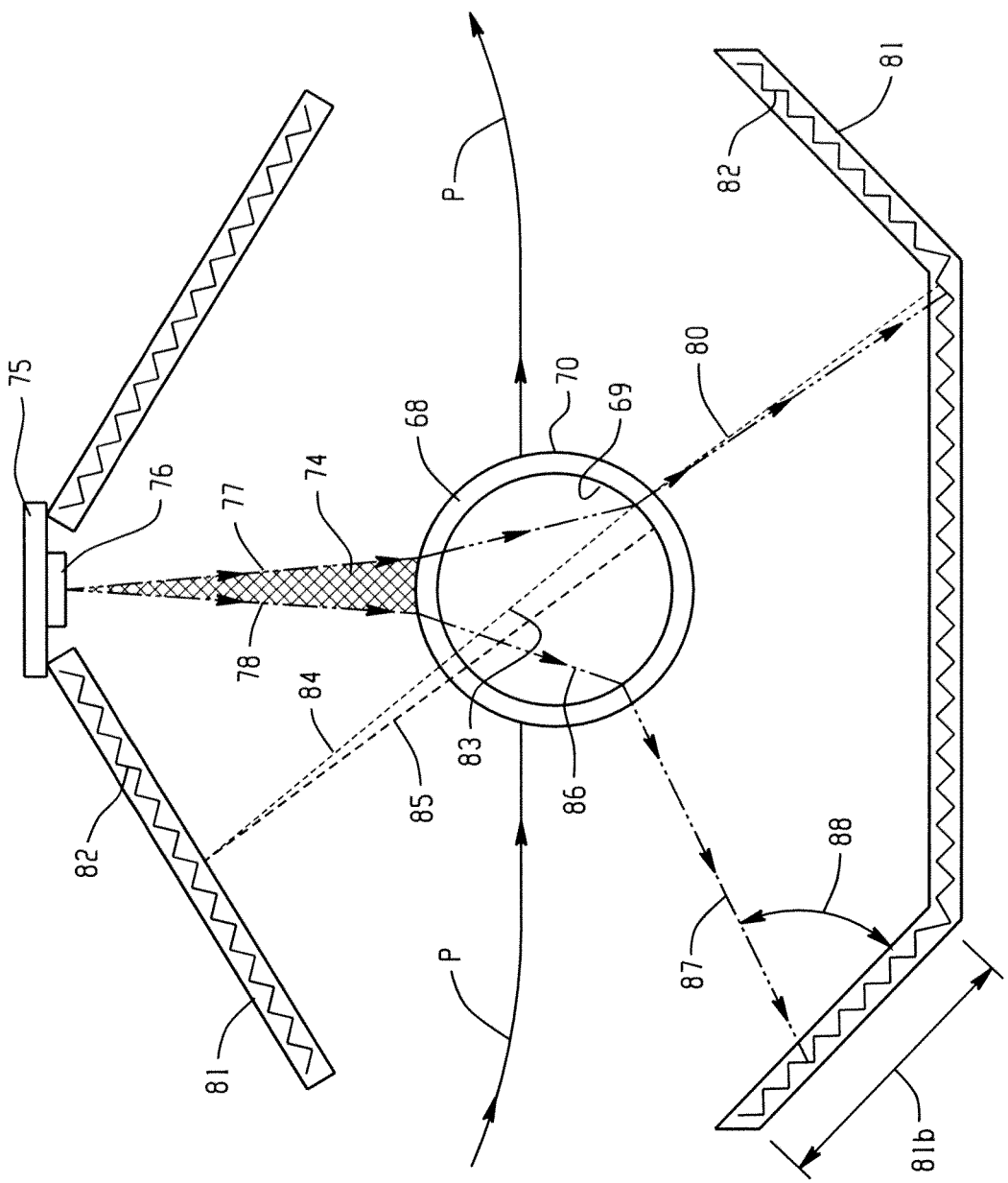
FIG. 6 is an illustration of a system for irradiating a bottle preform according to the presently described embodiments.

FIG. 6 shows a configuration similar to FIG. 5 except that the corner-cube reflector material (81) is configured to prevent the likelihood that the stray photons from irradiating the wall of the preform (68) will not be likely to arrive at an angle greater than +/−45° from orthogonal to the corner-cube reflector material surface (81). For example, after the photon represented by vector (78) passes through the preform (68) it is represented by vector (86) which passes through the preform again and emerges as vector (87) with its remaining energy. Note that angle (88) with which vector (87) strikes section (81b) of the corner-cube reflection material is at an angle substantially less than 45° from the orthogonal to section (81b). Note that section (81b) is turned compared to a similar section of (81) in FIG. 5b such that it reduces the angle at which vector (87) strikes the corner-cube reflection material (81). If the vector (81b) had not been turned up at an angle to reduce the impact angle of vector (87) to (81), the impact angle would be substantially larger than 45° and the corner-cube reflection material would not properly return the vector back in a close parallel path to the sending direction. It would allow the vector (87) to be randomly reflected as shown by vector (89) in FIG. 5b such that vector (89) would not restrike the target preform material. This type of configuration is also applicable to the system of FIG. 4(*b*). Thus, careful reconfiguring of how the corner-cube reflection material is oriented relative to the target and the likely sources of stray photons can result in a very efficient reuse of the photons and a high overall systemic efficiency. Also shown in FIG. 6 is a path P which represents a potential path for the preform 68 to follow for ingress and egress of the irradiation zone of the system. The path P may be linear or arcuate near or through the irradiation zone or chamber. A similar path may also be provided in the system of FIG. 5(*b*). Further, in either case, the path of the preform may be in or out of the page, as opposed to being across the page, as a function of the implementation of the heating or irradiation zone or cavity.

It should be appreciated that in any of the heating or irradiating applications described above, the system may be configured so that corner-cube reflective material, such as the sheets of corner-cube arrays described herein, may be provided to the walls of the system from which the irradiation source is disposed. In these cases, apertures of suitable size are provided through the wall and/or the corner-cube sheet material to allow for irradiation from the devices. However, these side openings of these apertures should be size preferably so as to maximize the amount of corner-cube material that is positioned on the subject surface. To illustrate, with reference to FIG. 7(*a*), a system 100 is shown. The system 100 includes a wall 102 that is opposite the irradiation sources and has disposed thereon sheets of corner-cube reflector arrays 104. The irradiation sources 110 are disposed opposite the first wall 102 and irradiate through wall 112 and corner-cube sheet material 114 through apertures 116. In this configuration, it should be appreciated that the apertures 116 may take the form of simple a hole, or clear or transparent material such as glass or plastic may be disposed in the aperture 116. Further, the aperture 116 may include an optical element such as a lens to provide enhanced focus on target material, depending on the application. Of course, the aperture 16 is shown as conventional holes within a wall and would be arranged in an array if the irradiation sources 110 were so arranged. However, it is contemplated that any suitable discontinuity or gap in the wall would suffice to provide for a sufficient angle for the irradiation sources 110 to irradiate through the wall toward the target items.

With reference to FIGS. 7(*b*)-(*d*), the corner-cube sheet material 114 includes a plurality of apertures 118 located at the apex of the corner-cube reflectors. The apertures 118 allow the irradiation sources 110 to irradiate through the corner-cube sheet material 114. It should be appreciated that the apertures 118 may take the form of simple a hole, or clear or transparent material such as glass or plastic may be disposed in the aperture 118. With reference to FIG. 7(*c*) it should be appreciated that the irradiation sources 110 may direct the irradiation using fiber optic cables or wires such as those represented at 120. Further, the aperture 118 may include an optical element 122 such as a lens to provide enhanced focus on target material, depending on the application as shown in FIG. 7(*d*). As illustrated, every other corner-cube reflector includes an aperture but it is contemplated that every corner-cube reflector include an aperture depending on the application.

It should also be appreciated that the presently described embodiments may be implemented in a variety of manners. However, in one form, the system comprises an irradiation source operative to produce irradiation wherein the irradiation source is configured to direct irradiation toward a target item. An irradiation zone is provided in which the target will be located for irradiation, the irradiation zone being at least partially defined by proximate corner-cube reflector material. The corner cube reflector material comprises an array of corner cube reflectors and is operative to reflect irradiation back to the target item, irradiation which has been, at least one of, reflected from, back-scattered from, or passed through the target item. In another form, the method comprises irradiating the target item using an irradiation source in an irradiation zone, and reflecting irradiation, which is one of reflected from, scattered from or transmitted through the target item, back to the target item using proximate corner-cube array reflector material defining at least partially the irradiation zone.

Examples have been described as to how corner-cube reflection can increase the efficiency of directed irradiation systems by redirecting photons back to the target item. While two specific examples were detailed, it should be appreciated that the concept is broadly applicable to directed irradiation systems for increasing the systemic efficiency dramatically. This technology can be broadly applied to many different application situations and many different target types by applying the concepts which are taught herein.

The exemplary embodiment has been described with reference to the preferred embodiments. Obviously, modification and alterations will occur to others upon reading and understanding the preceding detailed description. It is intended that the exemplary embodiment be construed as including all such modification and alterations insofar as they come within the scope of the appended claims or the equivalents thereof

The invention claimed is:

1. A system for irradiation treating or processing a target item, the system comprising:

an irradiation source operative to produce irradiation, the irradiation source comprising semiconductor laser devices configured to direct irradiation toward desired locations of a target item according to an irradiation pattern such that the target item can absorb irradiation in at least some desired locations of the target item; and an irradiation zone in which the target will be located for irradiation, the irradiation zone being substantially enclosed by proximate corner-cube reflector material positioned at least in areas of the irradiation zone where stray radiation is likely, the corner-cube reflector material comprising sheets sufficiently thin to reduce heating of the material having a smooth flat surface facing the irradiation zone to face the target item and having arrays of contiguous corner-cube reflectors configured and sized sufficiently small to be embedded in the sheets such that irradiation that has been, at least one of, reflected from or back-scattered from the target item, strikes a reflector of the array and is reflected by the reflector, is reflected back to the target item at substantially the same location on the target item from which such irradiation was, at least one of, reflected or back-scattered to increase efficiency of the system by increasing absorption of irradiation at the desired locations of the target item according to the irradiation pattern and preventing other heating in the system, wherein reflecting the irradiation back to the target item at substantially the same location on the target item from which such irradiation was, at least one of, reflected or back-scattered, preserves the irradiation pattern and is based on at least a minimized distance between parallel input rays and corresponding output rays of the reflector and an acceptance angle for the input rays to the reflector being less than 45° from a line orthogonal to a corresponding sheet of the corner-cube reflector material.

2. The system as set forth in claim 1 wherein the system is a cooking oven.

3. The system as set forth in claim 1 wherein the target item is a food or organic item.

4. The system as set forth in claim 1 wherein the system is included within a bottle forming system.

5. The system as set forth in claim 1 wherein the target item is a plastic bottle preform.

6. The system as set forth in claim 1 wherein the corner-cube reflector material includes at least one discontinuity through which irradiation can be directed through the corner-cube reflector material toward the target item.

7. The system as set forth in claim 6 wherein the discontinuity is an aperture.

8. The system as set forth in claim 1 wherein enclosure of the irradiation zone means more than half the enclosure of the irradiation zone.

9. The system as set forth in claim 1 wherein the corner-cube reflector material covers substantially all of the interior surface of the irradiation zone except that the corner-cube reflector material does not cover irradiation sources.

10. The system as set forth in claim 1 wherein the corner-cube reflector material is located based on redirection to the target item.

11. The system as set forth in claim 5 wherein the corner-cube reflector material circumferentially surrounds around a long axis of a preform but allowing for access to get preforms in and out of the irradiation chamber to facilitate high speed production.

12. The system of claim 11 wherein the access comprises allowing for either a linear or arcuate travel path through the irradiation chamber.

13. The system as set forth in claim 5 wherein corner-cube material surrounds a preform, forming an irradiation chamber during at least part of the time during which it is being irradiated.

14. The system as set forth in claim 1 wherein the corner-cube material incorporates a colored pigment such that the material appears as a colored surface to a human viewer and such that the corner-cube material reflects wavelengths of the irradiation.

15. The system as set forth in claim 1 wherein the corner-cube material is coated on at least one of a front surface or back surface such that the material reflects at least 85% of wavelengths above 750 nm.

16. The system as set forth in claim 1 wherein the corner-cube material is coated on at least one of a front or back surface and reflects at least 95% of wavelengths.

17. The system as set forth in claim 1 wherein the corner-cube material is operative to function above 1600 nm.

18. The system as set forth in claim 1 wherein the reflective coating is at least one of aluminum, silver, gold, copper, and cadmium or alloys thereof.

19. The system as set forth in claim 1 wherein the flat surface of the sheets is a smooth and washable surface.

20. The system as set forth in claim 1 wherein the irradiation source comprises an array of semiconductor surface emitting laser devices.

21. The system as set forth in claim 1 wherein the sheets are sufficiently thin and the reflectors sufficiently small such that the arrays comprise hundreds to thousands of corner cube reflectors.

22. The system as set forth in claim 1 wherein the array at least partially surrounds the irradiation zone.

23. The system as set forth in claim 1 wherein reflection back to substantially the same location on the target item is a function of at least one of acceptance angle of the array and dimensions of individual reflectors.

24. The system as set forth in claim 1 wherein each reflector of the array is configured such that an offset distance between an input ray of irradiation and an output ray of irradiation is sufficiently small so the reflector reflects the irradiation back to the target item at substantially the same location on the target item from which such irradiation was, at least one of, reflected, back-scattered, or passed through the target item.

25. The system as set forth in claim 1 wherein the irradiation pattern is a specific heat profile or signature facilitating non-uniform heating.

26. The system as set forth in claim 1 wherein the irradiation is for the purpose of at least one of heating, drying, curing and dehydrating the target item.

27. The system as set forth in claim 1 wherein target material is one of metal, glass or plastic in a manufacturing or filling process.

28. The system as set forth in claim 1 wherein the irradiation pattern corresponds to a heat pattern or signature having non-uniform subportions.

29. A method for irradiation treating or processing a target item, the method comprising:
   irradiating the target item at desired locations according to an irradiation pattern using an irradiation source comprising semiconductor laser devices in an irradiation zone such that the target item can absorb irradiation in at least some desired locations of the target item; and
   reflecting irradiation back to the target item at substantially the same location on the target item from which the irradiation is reflected, or scattered, using proximate corner-cube array reflector material substantially enclosing or covering an interior surface of the irradiation zone positioned at least in areas of the irradiation zone where stray radiation is likely, and comprising sheets sufficiently thin to reduce heating of the material having a smooth flat surface facing the target item and having arrays of contiguous corner-cube reflectors configured and sized sufficiently small to be embedded in the sheets such that irradiation that has been, at least one of, reflected from or back-scattered from the target item, strikes a reflector of the array and is reflected by the reflector, is reflected back to the target item at substantially the same location from which such irradiation was reflected or scattered to increase efficiency by increasing absorption of irradiation at the desired locations of the target item according to the irradiation pattern and preventing other heating,
   wherein reflecting the irradiation back to the target item at substantially the same location on the target item from which such irradiation was, at least one of, reflected or back-scattered, preserves the irradiation pattern and is based on at least a minimized distance between parallel input rays and corresponding output rays of the reflector and an acceptance angle for the input rays to the reflector being less than 45° from a line orthogonal to a corresponding sheet of the corner-cube reflector material.

30. The method as set forth in claim 29 wherein the irradiation is for the purpose of at least one of heating, drying, curing and dehydrating the target item.

31. The method of claim 30 wherein the irradiation arrangement is implemented within a cooking oven or a processing oven.

32. The method as set forth in claim 30 wherein the target item is a food or organic item.

33. The method as set forth in claim 30 wherein the method is implemented within a bottle forming system.

34. The method as set forth in claim 30 wherein the target item is a plastic bottle preform.

35. The method as set forth in claim 29 wherein target material is one of metal, glass or plastic in a manufacturing or filling process.

36. The method as set forth in claim 29 wherein the irradiation source comprises an array of semiconductor surface emitting laser devices.

37. The method as set forth in claim 29 wherein each reflector of the array is configured such that an offset distance between an input ray of irradiation and an output ray of irradiation is sufficiently small so the reflector reflects irradiation back to the target item at substantially the same location on the target item from which such irradiation was, at least one of, reflected, back-scattered, or passed through the target item.

38. The system as set forth in claim 29 wherein the irradiation pattern is a specific heat profile or signature facilitating non-uniform heating.

39. The method as set forth in claim 29 wherein the irradiation pattern corresponds to a heat pattern or signature having non-uniform subportions.

40. A cooking oven comprising:
an irradiation source comprising semiconductor surface emitting laser devices operative to produce irradiation,
the irradiation source configured to direct irradiation toward desired locations of a food item according to an irradiation pattern such that the food item can absorb irradiation in at least some desired locations of the food item; and
an irradiation zone in which the food item will be located for irradiation, the irradiation zone having an interior surface substantially covered by corner-cube reflector material positioned at least in areas of the irradiation zone where stray radiation is likely, the corner-cube reflector material comprising sheets sufficiently thin to reduce heating of the material having a smooth flat surface facing the irradiation zone to face the food item and having arrays of contiguous corner-cube reflectors sized sufficiently small and configured such that irradiation that has been, at least one of, reflected from or back-scattered from the food item, strikes a reflector of the array and is reflected by the reflector, is reflected back to the food item at substantially the same location on the food item from which such irradiation was, at least one of reflected or back-scattered to increase efficiency of the oven by increasing absorption of irradiation at the desired locations of the food item according to the irradiation pattern and preventing other heating in the oven,
wherein reflecting the irradiation back to the target item at substantially the same location on the target item from which such irradiation was, at least one of, reflected or back-scattered, preserves the irradiation pattern and is based on at least a minimized distance between parallel input rays and corresponding output rays of the reflector and an acceptance angle for the input rays to the reflector being less than 45° from a line orthogonal to a corresponding sheet of the corner-cube reflector material.

41. The cooking oven as set forth in claim 40 wherein the sheets are sufficiently thin and the reflectors sufficiently small such that the arrays comprise hundreds to thousands of corner cube reflectors.

42. The cooking oven as set forth in claim 40 wherein the array lines the irradiation zone.

43. The oven as set forth in claim 40 wherein the corner-cube reflector material covers substantially all of the interior surface of the irradiation zone except that the corner-cube reflector material does not cover irradiation sources.

44. The oven as set forth in claim 40 wherein each reflector of the array is configured such that an offset distance between an input ray of irradiation and an output ray of irradiation is sufficiently small so the reflector reflects irradiation back to the food item at substantially the same location on the target item from which such irradiation was, at least one of, reflected, back-scattered, or passed through the food item.

45. The system as set forth in claim 40 wherein the irradiation pattern is a specific heat profile or signature facilitating non-uniform heating.

46. The cooking oven as set forth in claim 40 wherein the irradiation pattern corresponds to a heat pattern or signature having non-uniform subportions.

47. A system for irradiation treating or processing a target item, the system comprising:
an irradiation source operative to produce irradiation,
the irradiation source configured to direct irradiation toward desired locations of a target item such that the target item can absorb irradiation in at least some desired locations of the target item; and
an irradiation zone in which the target will be located for irradiation, the irradiation zone being at least partially enclosed by proximate corner-cube reflector material, the corner-cube reflector material comprising an array of contiguous corner-cube reflectors sized sufficiently small and configured such that irradiation that has been, at least one of, reflected from, back-scattered from, or passed through the target item, strikes a reflector of the array and is reflected by the reflector, is reflected back to the target item at substantially the same location on the target item from which such irradiation was, at least one of, reflected, back-scattered, or passed through the target item to increase efficiency of the system by increasing absorption of irradiation at the desired locations of the target item and preventing other heating in the system,
wherein at least one of the reflectors includes a non-reflective apex.

48. The system as set forth in claim 47 wherein the non-reflective apex comprises a geometry, material or coating to render the apex non-reflective.

49. A cooking oven comprising:
an irradiation source comprising semiconductor devices operative to produce irradiation,
the irradiation source configured to direct irradiation toward desired locations of a food item such that the food item can absorb irradiation in at least some desired locations of the food item; and
an irradiation zone in which the food item will be located for irradiation, the irradiation zone being at least partially enclosed by proximate corner-cube reflector material, the corner-cube reflector material comprising an array of contiguous corner-cube reflectors sized sufficiently small and configured such that irradiation that has been, at least one of, reflected from, back-scattered from, or passed through the food item, strikes a reflector of the array and is reflected by the reflector, is reflected back to the food item at substantially the same location on the food item from which such irradiation was, at least one of reflected, back-scattered, or passed through the food item to increase efficiency of the oven by increasing absorption of irradiation at the desired locations of the food item and preventing other heating in the oven, wherein at least one of the reflectors includes a non-reflective apex.

50. The system as set forth in claim 49 wherein the non-reflective apex comprises a geometry, material or coating to render the apex non-reflective.

* * * * *